(12) United States Patent
Shirai

(10) Patent No.: US 12,557,685 B2
(45) Date of Patent: Feb. 17, 2026

(54) SEMICONDUCTOR DEVICE AND METHOD FOR MANUFACTURING SEMICONDUCTOR DEVICE

(71) Applicant: ROHM CO., LTD., Kyoto (JP)

(72) Inventor: Katsutoki Shirai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 663 days.

(21) Appl. No.: 17/906,936

(22) PCT Filed: Oct. 28, 2020

(86) PCT No.: PCT/JP2020/040372
§ 371 (c)(1),
(2) Date: Sep. 21, 2022

(87) PCT Pub. No.: WO2021/192384
PCT Pub. Date: Sep. 30, 2021

(65) Prior Publication Data
US 2023/0116738 A1    Apr. 13, 2023

(30) Foreign Application Priority Data

Mar. 25, 2020 (JP) ................................ 2020-054750
Mar. 25, 2020 (JP) ................................ 2020-054751

(51) Int. Cl.
H01L 23/00      (2006.01)

(52) U.S. Cl.
CPC .............. *H01L 24/05* (2013.01); *H01L 24/45* (2013.01); *H01L 24/85* (2013.01);
(Continued)

(58) Field of Classification Search
CPC ....... H01L 23/522; H01L 24/45; H01L 24/85; H01L 24/48; H01L 24/49;
(Continued)

(56) References Cited

U.S. PATENT DOCUMENTS

2004/0227257 A1* 11/2004 Bayerer ................. H01L 24/85
  257/786
2007/0057350 A1* 3/2007 Otremba ........... H01L 23/49562
  257/E23.044

(Continued)

FOREIGN PATENT DOCUMENTS

JP    2002222826 A    8/2002
JP    2014179541 A    9/2014
(Continued)

OTHER PUBLICATIONS

International Search Report issued for International Patent Application No. PCT/JP2020/040372, Date of mailing: Jan. 26, 2021, 5 pages including English translation.
(Continued)

*Primary Examiner* — Mouloucoulaye Inoussa
(74) *Attorney, Agent, or Firm* — HSML P.C.

(57) ABSTRACT

A semiconductor device according to one aspect includes a pad portion, an insulating layer that supports the pad portion, a first wiring layer that is formed in a layer below the pad portion and extends in a first direction below the pad portion, and a conductive member that is joined to a front surface of the pad portion and extends in a direction forming an angle of −30° to 30° with respect to the first direction. A semiconductor device according to another aspect includes a pad portion, an insulating layer that supports the pad portion, a first wiring layer that is formed in a layer below the pad portion and extends in a first direction below the pad portion, and a conductive member that is joined to a front surface of the pad portion and has a joint portion that is long in one direction in plan view and an angle of a long direction of the joint portion with respect to the first direction is −30° to 30°.

13 Claims, 19 Drawing Sheets

(52) U.S. Cl.
CPC .............. *H01L 2224/05624* (2013.01); *H01L 2224/05647* (2013.01); *H01L 2224/05655* (2013.01); *H01L 2224/45124* (2013.01); *H01L 2224/45147* (2013.01); *H01L 2224/85205* (2013.01)

(58) Field of Classification Search
CPC . H01L 23/49562; H01L 21/768; H01L 24/05; H01L 21/50; H01L 23/12; H01L 23/4952; H01L 21/3205; H01L 24/84; H01L 23/3142; H01L 23/49541; H01L 23/49524; H01L 24/40; H01L 23/49575; H01L 23/49513; H01L 23/3107; H01L 21/4828; H01L 23/49555; H01L 23/3114; H01L 23/5283; H01L 23/5226; H01L 23/528; H01L 23/49531; H01L 24/06; H01L 24/09; H01L 2224/29339; H01L 2224/73265; H01L 2224/32245; H01L 2224/48096; H01L 2224/45147; H01L 2224/49171; H01L 2224/05655; H01L 2224/85206; H01L 2224/05624; H01L 2224/83801; H01L 2224/92247; H01L 2224/05647; H01L 2224/4903; H01L 2924/00011; H01L 2224/04034; H01L 2224/29139; H01L 2224/37147; H01L 2224/37013; H01L 2224/45139; H01L 2224/40132; H01L 2224/05567; H01L 2224/2939; H01L 2224/48247; H01L 2924/13091; H01L 2224/04042; H01L 2224/49113; H01L 2224/48472; H01L 2224/05553; H01L 2224/05599; H01L 2224/49177; H01L 2224/49176

See application file for complete search history.

(56) References Cited

U.S. PATENT DOCUMENTS

| | | | | |
|---|---|---|---|---|
| 2008/0128755 A1* | 6/2008 | Fukamizu | ............... | H01L 24/49 257/E21.627 |
| 2010/0200898 A1* | 8/2010 | Lin | ......................... | H10F 77/50 257/E31.11 |
| 2012/0211762 A1* | 8/2012 | Imada | ................... | H01L 23/4952 257/734 |
| 2014/0264383 A1* | 9/2014 | Kajiwara | .............. | H01L 23/562 257/77 |
| 2014/0273353 A1* | 9/2014 | Yasunaga | ............ | H01L 25/0657 438/125 |
| 2015/0084135 A1* | 3/2015 | Miura | ...................... | H01L 24/05 257/401 |
| 2015/0263002 A1* | 9/2015 | Matsumoto | ............. | H01L 24/48 257/390 |
| 2016/0315031 A1* | 10/2016 | Akimoto | ............ | H01L 21/4828 |
| 2017/0062375 A1* | 3/2017 | Ishizuka | ................. | H01L 24/49 |
| 2017/0221803 A1* | 8/2017 | Kamachi | ................. | H01L 24/85 |
| 2018/0090461 A1 | 3/2018 | Tanaka et al. | | |
| 2018/0151533 A1* | 5/2018 | Yoneda | ................... | H01L 24/16 |
| 2018/0315684 A1* | 11/2018 | Sato | ........................ | H01L 24/05 |
| 2018/0331210 A1* | 11/2018 | Mori | ..................... | H10D 30/668 |
| 2019/0378784 A1* | 12/2019 | Higashida | ........... | H01L 23/5283 |
| 2020/0035638 A1* | 1/2020 | Okunishi | ............... | H01L 24/46 |
| 2020/0091046 A1* | 3/2020 | Sato | ........................ | H01L 24/85 |
| 2020/0312750 A1* | 10/2020 | Shirai | ................. | H01L 23/3114 |
| 2021/0098346 A1* | 4/2021 | Okuyama | .............. | H01L 24/48 |
| 2021/0305175 A1* | 9/2021 | Abe | ....................... | H01L 21/565 |
| 2022/0173009 A1* | 6/2022 | Takewaki | ................ | H01L 24/48 |

FOREIGN PATENT DOCUMENTS

| | | |
|---|---|---|
| JP | 2018061018 A | 4/2018 |
| JP | 2019212828 A | 12/2019 |
| WO | 2015129415 A1 | 9/2015 |

OTHER PUBLICATIONS

Written Opinion issued for International Patent Application No. PCT/JP2020/040372, Date of mailing: Jan. 26, 2021, 6 pages including English machine translation.

Notice of Reason for Refusal issued for Japanese Patent Application No. 2022-509236, Dispatch date: Sep. 5, 2024, 6 pages including English machine translation.

First Office Action issued for Chinese Patent Application No. 202080098988.3, dated Jun. 16, 2025, 17 pages including English machine translation.

* cited by examiner

A1

A1

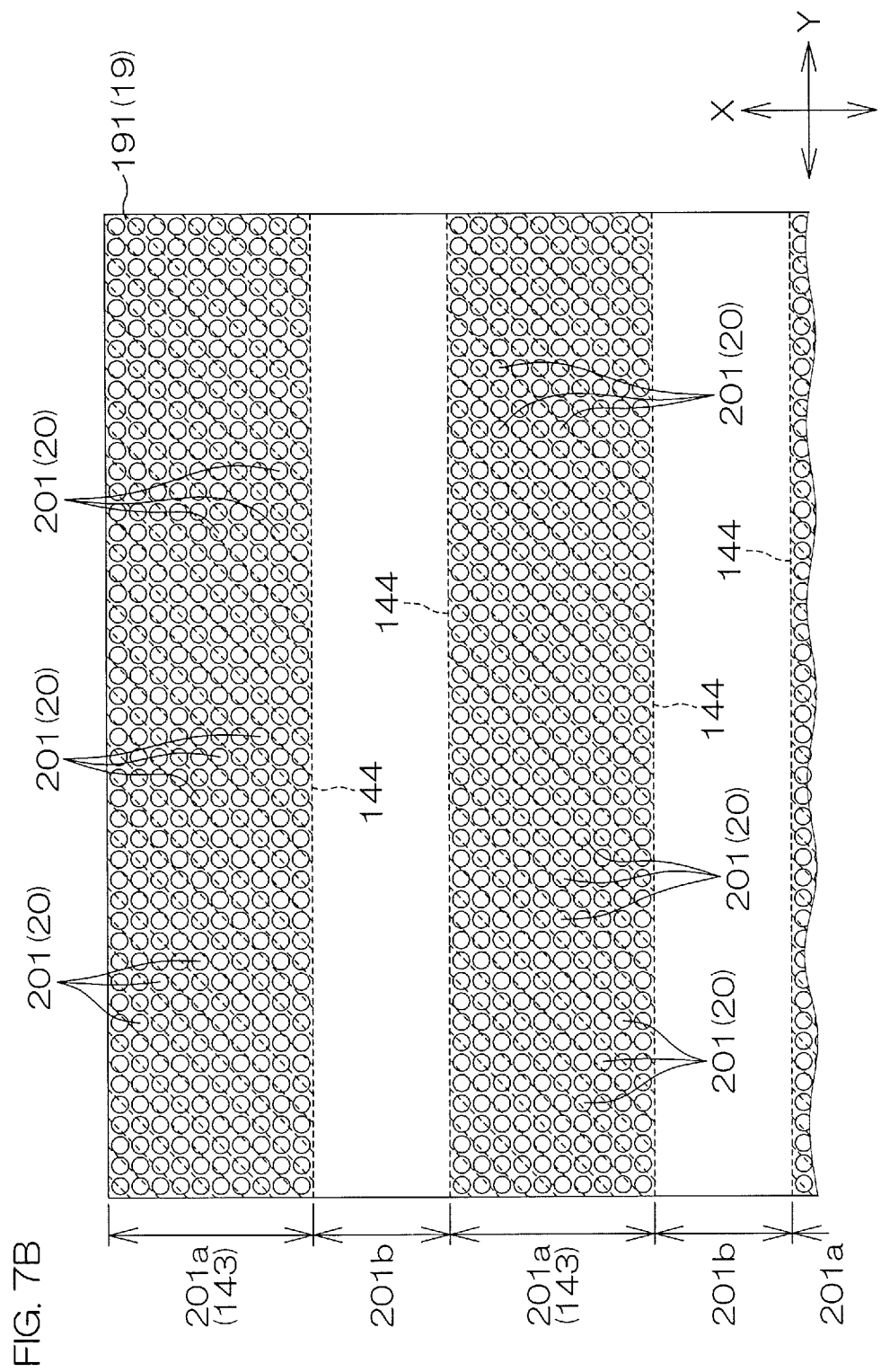

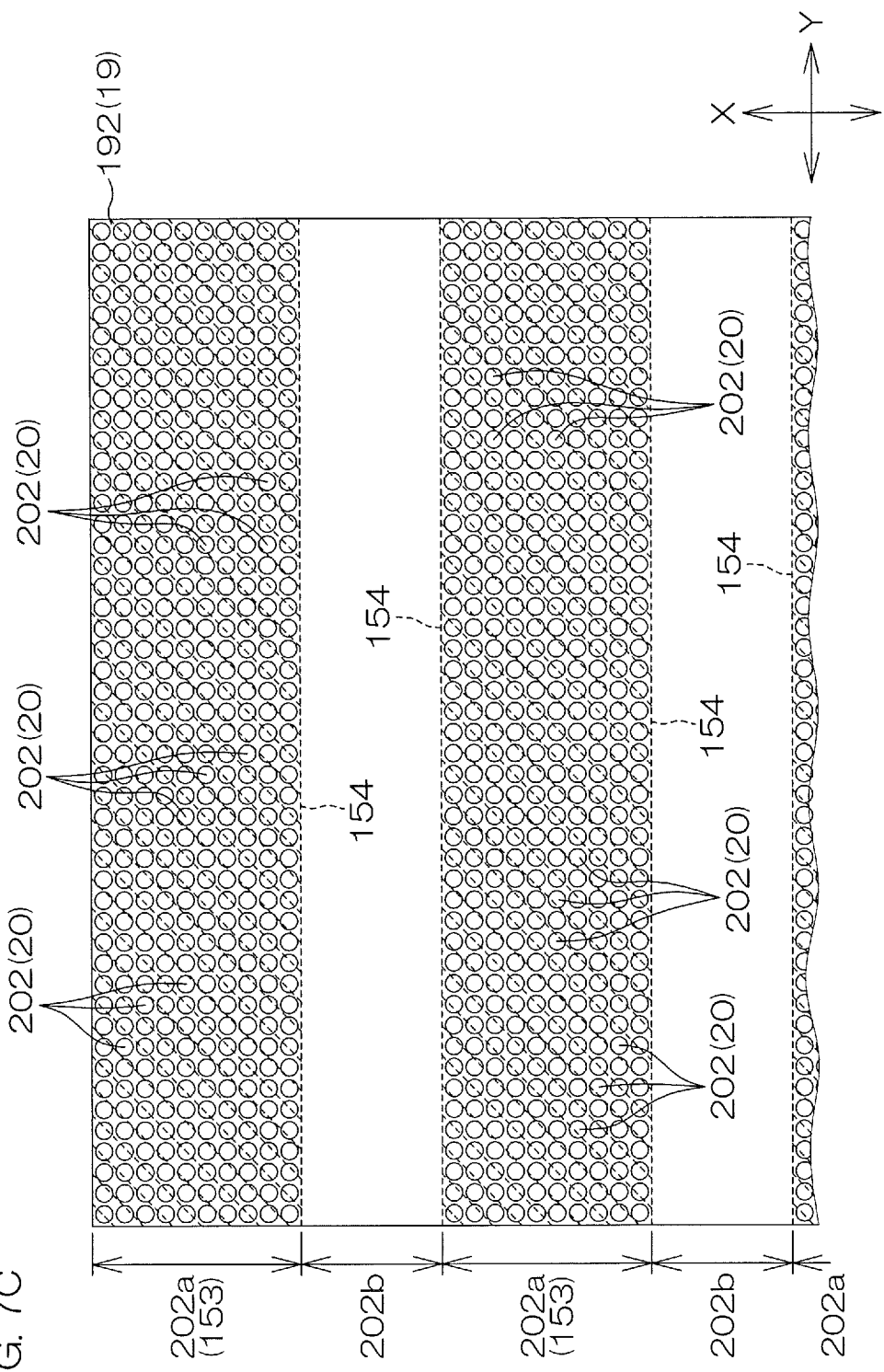

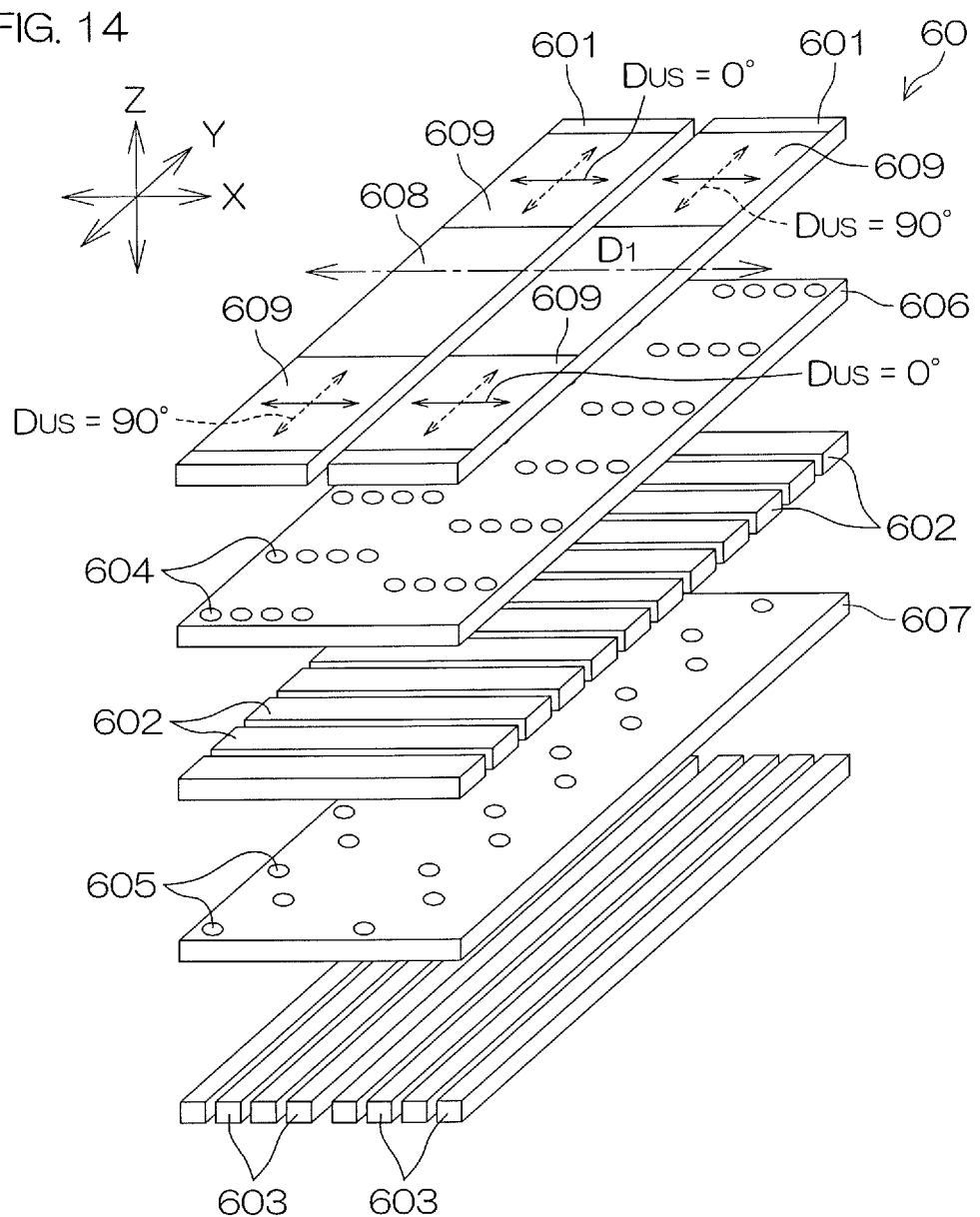

FIG. 15  Direction of ultrasonic waves is 0° ( Dus = 0° )

| Load [%] \ Intensity of ultrasonic waves [%] | 70 | 80 | 90 | 100 | 110 | 120 | 130 | 140 | 150 | 160 |
|---|---|---|---|---|---|---|---|---|---|---|
| 92.5 | A | | | | | | | | | |
| 95.0 | | A | | | | | | | | |
| 97.5 | | | A | | | | | | | |
| 100.0 | | | | A | | | | | | |
| 102.5 | | | | | A | | | | | |
| 105.0 | | | | | | A | | | | |
| 107.5 | | | | | | | A | | | |
| 110.0 | | | | | | | | A | | |
| 112.5 | | | | | | | | | B | |
| 115.0 | | | | | | | | | | C |

A : Crack formation rate   0%
B : Crack formation rate   Less than 10%
C : Crack formation rate   Not less than 10%

FIG. 16  Direction of ultrasonic waves is 90° ( Dus = 90° )

| Load [%] \ Intensity of ultrasonic waves [%] | 70 | 80 | 90 | 100 | 110 | 120 | 130 | 140 | 150 | 160 |
|---|---|---|---|---|---|---|---|---|---|---|
| 92.5 | B | | | | | | | | | |
| 95.0 | | B | | | | | | | | |
| 97.5 | | | B | | | | | | | |
| 100.0 | | | | B | | | | | | |
| 102.5 | | | | | B | | | | | |
| 105.0 | | | | | | B | | | | |
| 107.5 | | | | | | | B | | | |
| 110.0 | | | | | | | | C | | |
| 112.5 | | | | | | | | | C | |
| 115.0 | | | | | | | | | | C |

A : Crack formation rate  0%
B : Crack formation rate  Less than 10%
C : Crack formation rate  Not less than 10%

SEMICONDUCTOR DEVICE AND METHOD FOR MANUFACTURING SEMICONDUCTOR DEVICE

TECHNICAL FIELD

The present invention relates to a semiconductor device and a method for manufacturing the same.

BACKGROUND ART

For example, Patent Literature 1 discloses a semiconductor device having a die pad, an SiC chip mounted on the die pad, a porous first sintered Ag layer that joins the die pad and the SiC chip, a reinforcing resin portion that covers a front surface of the first sintered Ag layer and is formed to a fillet shape, a source lead that is electrically connected to a source electrode of the SiC chip, a gate lead that is electrically connected to a gate electrode, a drain lead that is electrically connected to a drain electrode, and a sealing body that covers the SiC chip, the first sintered Ag layer, and a portion of the die pad.

CITATION LIST

Patent Literature

Patent Literature 1: Japanese Patent Application Publication No. 2014-179541

SUMMARY OF INVENTION

Solution to Problem

A semiconductor device according to a preferred embodiment of the present invention includes a pad portion, an insulating layer that supports the pad portion, a first wiring layer that is formed in a layer below the pad portion and extends in a first direction below the pad portion, and a conductive member that is joined to a front surface of the pad portion and extends in a direction forming an angle of −30° to 30° with respect to the first direction.

BRIEF DESCRIPTION OF DRAWINGS

FIG. 7B is an enlarged plan view of principal portions of first via portions of FIG. 7A.

FIG. 7C is an enlarged plan view of principal portions of second via portions of FIG. 7A.

FIG. 14 is a diagram for describing the application direction of ultrasonic waves.

FIG. 15 is a diagram of evaluation of crack formation rate when the application direction of ultrasonic waves is in a direction of 0° (parallel direction) with respect to a long direction of second plate members.

FIG. 16 is a diagram of evaluation of crack formation rate when the application direction of ultrasonic waves is in a direction of 90° (orthogonal direction) with respect to the long direction of the second plate members.

DESCRIPTION OF EMBODIMENTS

Preferred Embodiments of the Present Invention

Figure 1:
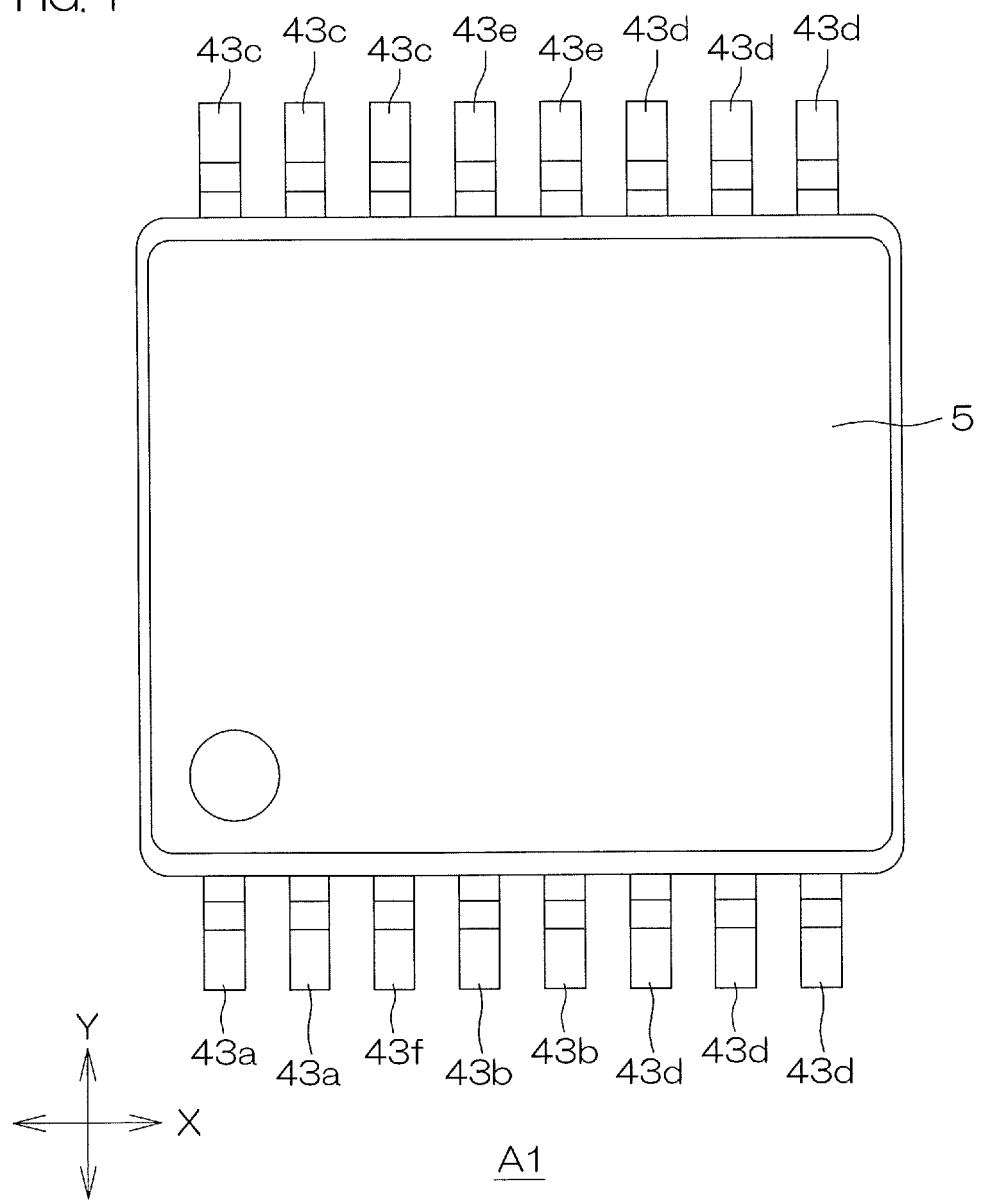
FIG. 1 is a plan view of a semiconductor device according to a preferred embodiment of the present invention.

First, preferred embodiments of the present invention shall be listed and described.

A semiconductor device according to a preferred embodiment of the present invention includes a pad portion, an insulating layer that supports the pad portion, a first wiring layer that is formed in a layer below the pad portion and extends in a first direction below the pad portion, and a conductive member that is joined to a front surface of the pad portion and extends in a direction forming an angle of −30° to 30° with respect to the first direction.

A semiconductor device according to a preferred embodiment of the present invention includes a pad portion, an insulating layer that supports the pad portion, a first wiring layer that is formed in a layer below the pad portion and extends in a first direction below the pad portion, and a conductive member that is joined to a front surface of the pad portion and has a joint portion that is long in one direction in plan view and an angle of a long direction of the joint portion with respect to the first direction may be −30° to 30°.

A semiconductor device according to a preferred embodiment of the present invention can be manufactured, for example, by a method for manufacturing semiconductor device according to a preferred embodiment of the present invention that includes a step of preparing a semiconductor substrate including a pad portion, an insulating layer that supports the pad portion, and a first wiring layer that is formed in a layer below the pad portion and extends in a first direction below the pad portion and a step of joining a conductive member to a front surface of the pad portion by an ultrasonic vibration applied along a direction that forms an angle of −30° to 30° with respect to the first direction.

According to this method, a vibration direction of ultrasonic waves is the direction that forms the angle of −30° to 30° with respect to the first direction. Forming of a crack in the insulating layer can thereby be suppressed. Here, the first wiring layer that extends in the first direction below the pad portion may include, for example, a first wiring layer that extends in the first direction such as to overlap with the pad portion in plan view. Also, one first wiring layer may extend in the first direction in a region below the pad portion or a plurality of first wiring layers that are mutually separated in the region below the pad portion may extend in the first direction.

With the semiconductor device according to the preferred embodiment of the present invention, a joint portion of the conductive member with respect to the pad portion may include a joint portion that is long in one direction in plan view.

With the semiconductor device according to the preferred embodiment of the present invention, the pad portion may contain a material having aluminum as a main component.

With the semiconductor device according to the preferred embodiment of the present invention, the conductive member may contain a material having either of aluminum and copper as a main component.

With the semiconductor device according to the preferred embodiment of the present invention, two or more of the joint portions of the conductive member may be formed.

With the semiconductor device according to the preferred embodiment of the present invention, the conductive member may include a linear member having a thickness of 100 μm to 600 μm.

According to this arrangement, a comparatively large current can be made to flow using the linear member because the thickness of the conductive member of linear shape is 100 μm to 600 μm.

With the semiconductor device according to the preferred embodiment of the present invention, a thickness of the pad portion may be 1.6 μm to 6.0 μm.

According to this arrangement, a force applied to the pad portion during joining of the conductive member can be made less likely to be transmitted to the insulating layer because the thickness of the pad portion is 1.6 μm to 6.0 μm. Consequently, the forming of a crack in the insulating layer can be suppressed.

The semiconductor device according to the preferred embodiment of the present invention may include a semiconductor substrate that has a substrate principal surface, a first element electrode that is formed on the substrate principal surface and is in conduction with the first wiring layer, a second element electrode that is formed on the substrate principal surface at an interval from the first element electrode and with which a channel current flows between it and the first element electrode via the semiconductor substrate, and a second wiring layer that is formed in the same layer as the first wiring layer at an interval from the first wiring layer and is in conduction with the second element electrode.

Among such cases where an element structure through which the channel current flows in a lateral direction along the substrate principal surface is formed in the semiconductor substrate, there is a case where, due to restriction of space on the semiconductor substrate, the second wiring layer is formed in a periphery of the first wiring layer. If in such a case, the forming of a crack in the insulating layer can be suppressed as described above, short-circuiting between the first wiring layer and the second wiring layer can be suppressed. Consequently, a semiconductor device of high reliability can be provided.

The semiconductor device according to the preferred embodiment of the present invention may include a third wiring layer that is formed in a layer below the first wiring layer and extends in a second direction below the first wiring layer and the second direction may be parallel or orthogonal to the first direction.

With the semiconductor device according to the preferred embodiment of the present invention, the pad portion may include a front surface to which the conductive member is joined and the front surface of the pad portion may contain a material having nickel as a main component.

With the semiconductor device according to the preferred embodiment of the present invention, the pad portion may include a first portion that is formed of a material having copper as a main component, a second portion that is formed of a material having nickel as a main component on the first portion, and a third portion that is formed of a material having palladium as a main component on the second portion and forms the front surface of the pad portion.

DETAILED DESCRIPTION OF PREFERRED EMBODIMENTS OF THE PRESENT INVENTION

Next, preferred embodiments of the present invention shall be described in detail with reference to the attached drawings.

<<Overall Structure of a Semiconductor Device A1>>

FIG. 1 to FIG. 6 show a semiconductor device A1 according to a preferred embodiment of the present invention.

The semiconductor device A1 includes a plurality of first semiconductor elements 1, a second semiconductor element 2, a plurality of first conductive members 31, a plurality of second conductive members 32, a lead frame 4, and a sealing resin 5. In this preferred embodiment, each first conductive member 31 may be an example of a "conductive member" described in the Claims.

Figure 2:
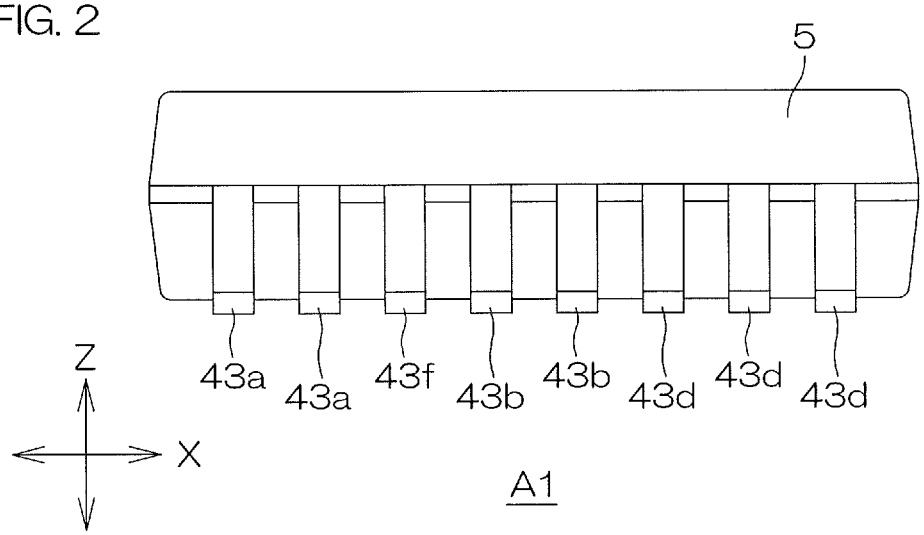
FIG. 2 is a front view of the semiconductor device according to the preferred embodiment of the present invention.
Figure 3:
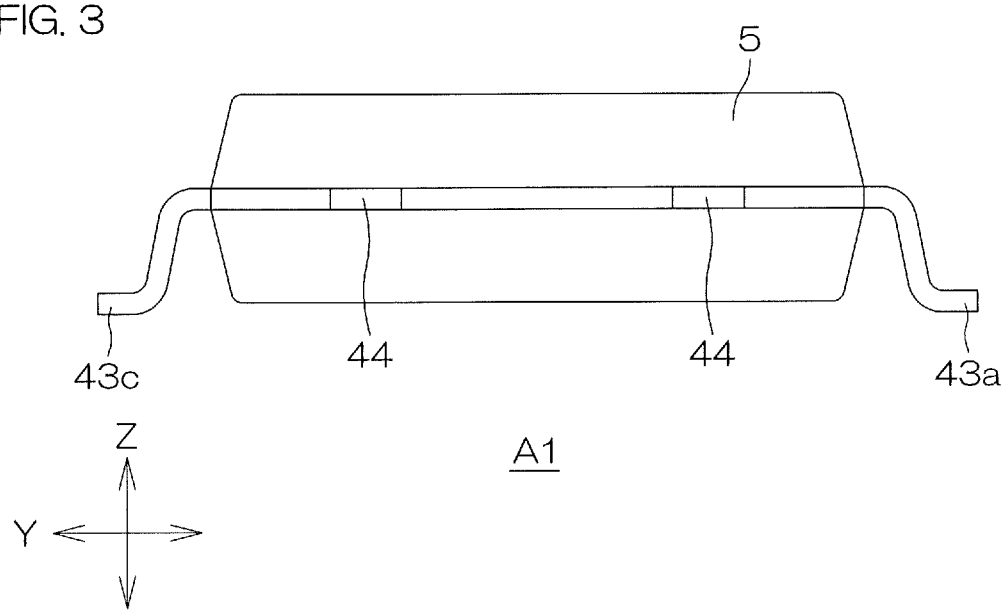
FIG. 3 is a side view of the semiconductor device according to the preferred embodiment of the present invention.
Figure 4:
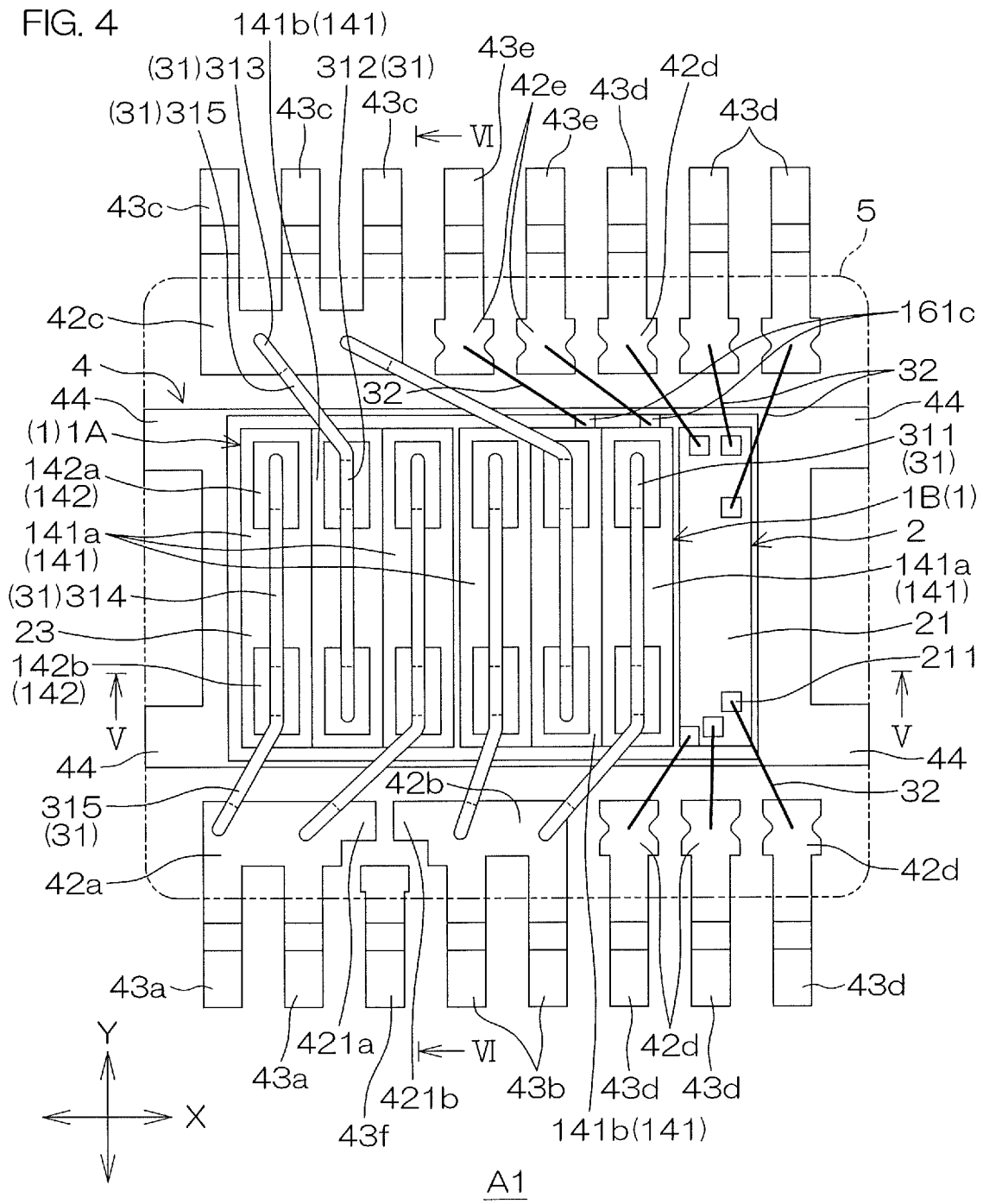
FIG. 4 is a diagram with which a sealing resin in the plan view of FIG. 1 has been omitted.
Figure 5:
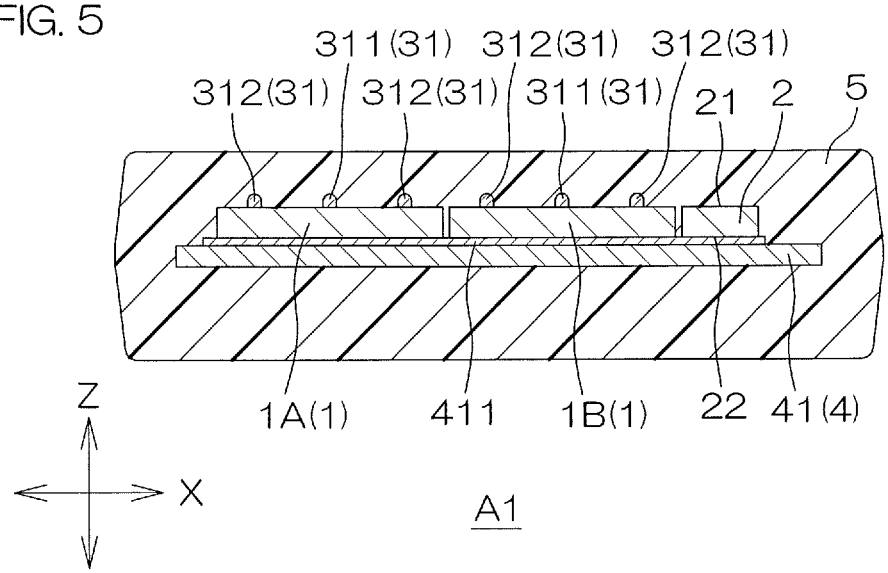
FIG. 5 is a sectional view taken along line V-V of FIG. 4.
Figure 6:
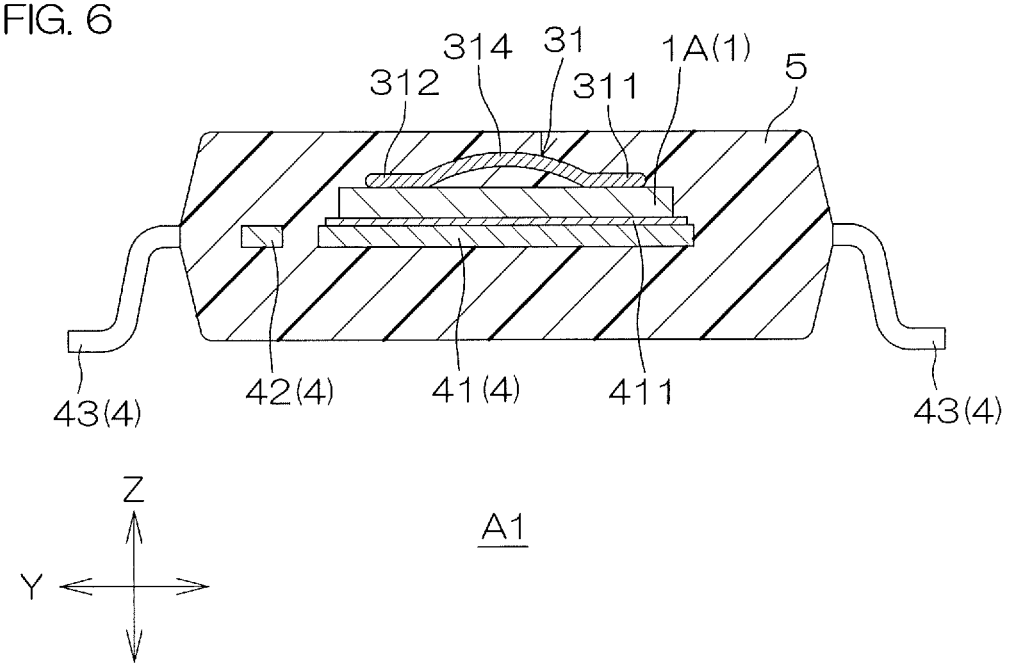
FIG. 6 is a sectional view taken along line VI-VI of FIG. 4.

FIG. 1 is a plan view of the semiconductor device A1. FIG. 2 is a front view of the semiconductor device A1. FIG. 3 is a side view of the semiconductor device A1. FIG. 4 is a diagram with which a sealing resin 5 in the plan view of FIG. 1 has been omitted. In this figure, the sealing resin 5 is indicated by an imaginary line (alternate long and two short dashed line). FIG. 5 is a sectional view taken along line V-V of FIG. 4. FIG. 6 is a sectional view taken along line VI-VI of FIG. 4. For convenience of description, three directions that are orthogonal to each other shall be defined as an X direction, a Y direction, and a Z direction. The Z direction is a thickness direction of the semiconductor device A1. The X direction is a right-left direction in the plan view (see FIG. 1) of the semiconductor device A1. The Y direction is an up-down direction in the plan view (see FIG. 1) of the semiconductor device A1.

The semiconductor device A1 is of a form that is surface mounted on a circuit board for various electronic equipment, etc. In this preferred embodiment, the semiconductor device A1 is a semiconductor package called SOP (small outline package). Although the semiconductor device A1 is, for example, a power supply IC in this preferred embodiment, it is not restricted thereto.

The plurality of first semiconductor elements 1 and the second semiconductor element 2 are elements that serve as a core of functions of the semiconductor device A1.

Each of the plurality of first semiconductor elements 1 may be a power semiconductor element. In this preferred embodiment, each first semiconductor element 1 may, for example, be a MOSFET of lateral type. Also, each first semiconductor element 1 is not restricted to a MOSFET. In this preferred embodiment, the semiconductor device A1 includes two first semiconductor elements 1. Here, for convenience of understanding, the two first semiconductor elements 1 are distinguished at times as a first semiconductor element 1A and a second first semiconductor element 1B. The two first semiconductor elements 1A and 1B are aligned in the X direction and the first semiconductor element 1B is sandwiched by the first semiconductor element 1A and the second semiconductor element 2.

The second semiconductor element 2 may be a controller IC for controlling driving of the plurality of first semiconductor elements 1. The second semiconductor element 2 may be in conduction with each of the first semiconductor elements 1 and may control each of the first semiconductor elements 1.

The plurality of first semiconductor elements 1 and the second semiconductor element 2 all have a rectangular shape in a view from the Z direction (also referred to hereinafter as "plan view"). Also, an entirety of the plurality of first semiconductor elements 1 and the second semiconductor element 2 is of rectangular shape in plan view. Therefore, a Y-direction dimension of the plurality of first semiconductor elements 1 and a Y-direction dimension of the second semiconductor element 2 are substantially the same. Also, the plurality of first semiconductor elements 1 and the second semiconductor element 2 together have an X-direction dimension of approximately 3 mm and a Y-direction dimension of approximately 2 mm.

Each of the first semiconductor elements 1 respectively includes a semiconductor substrate 11, a plurality of element electrodes 12, a wiring layer 13, an insulating layer 19, a plurality of vias 20, and a protective layer 23. Here, the semiconductor substrate 11 may be shared by the first semiconductor elements 1A and 1B.

Figure 7A:
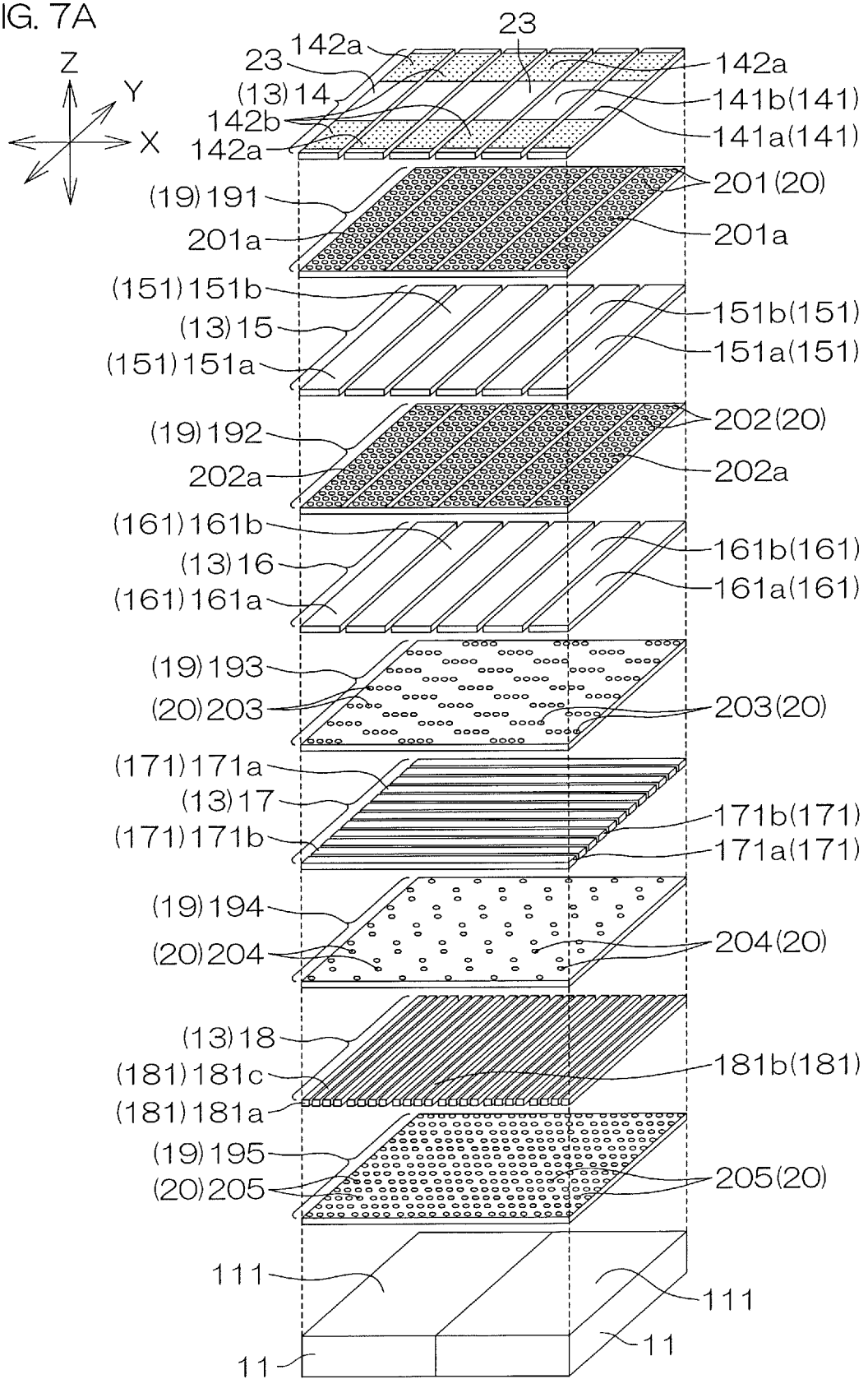
FIG. 7A is an exploded perspective view for describing a first semiconductor element.
Figure 11:
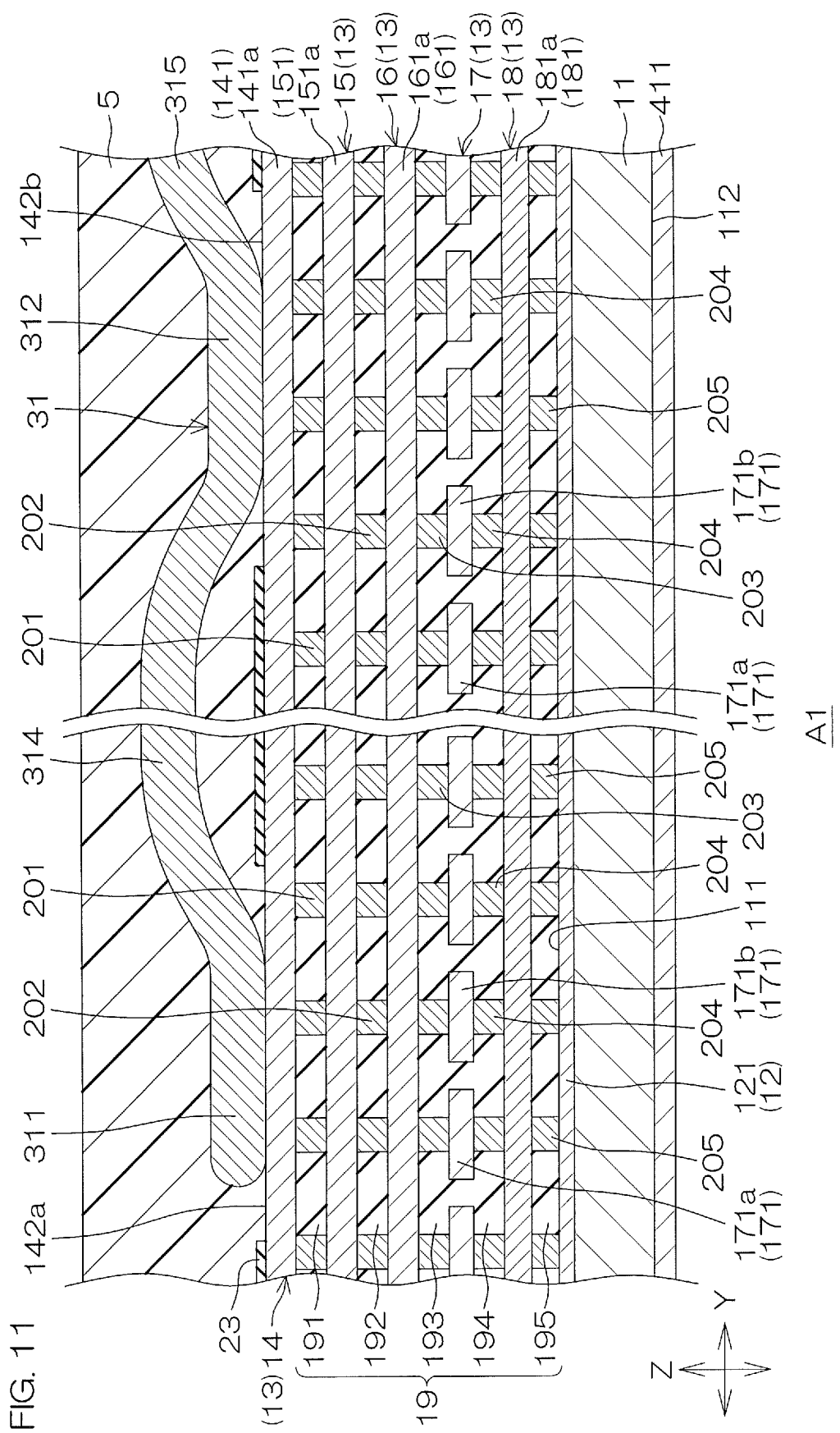
FIG. 11 is a sectional view taken along line XI-XI of FIG. 8.

FIGS. 7A, B, and C to FIG. 11 are diagrams for describing a detailed arrangement of the first semiconductor elements 1. FIG. 7A is an exploded perspective view for describing the wiring layer 13, the insulating layer 19, and the plurality of vias 20 in the plurality of first semiconductor elements 1. In this figure, the plurality of element electrodes 12 and a portion of the insulating layer 19 are omitted.

Figure 8:
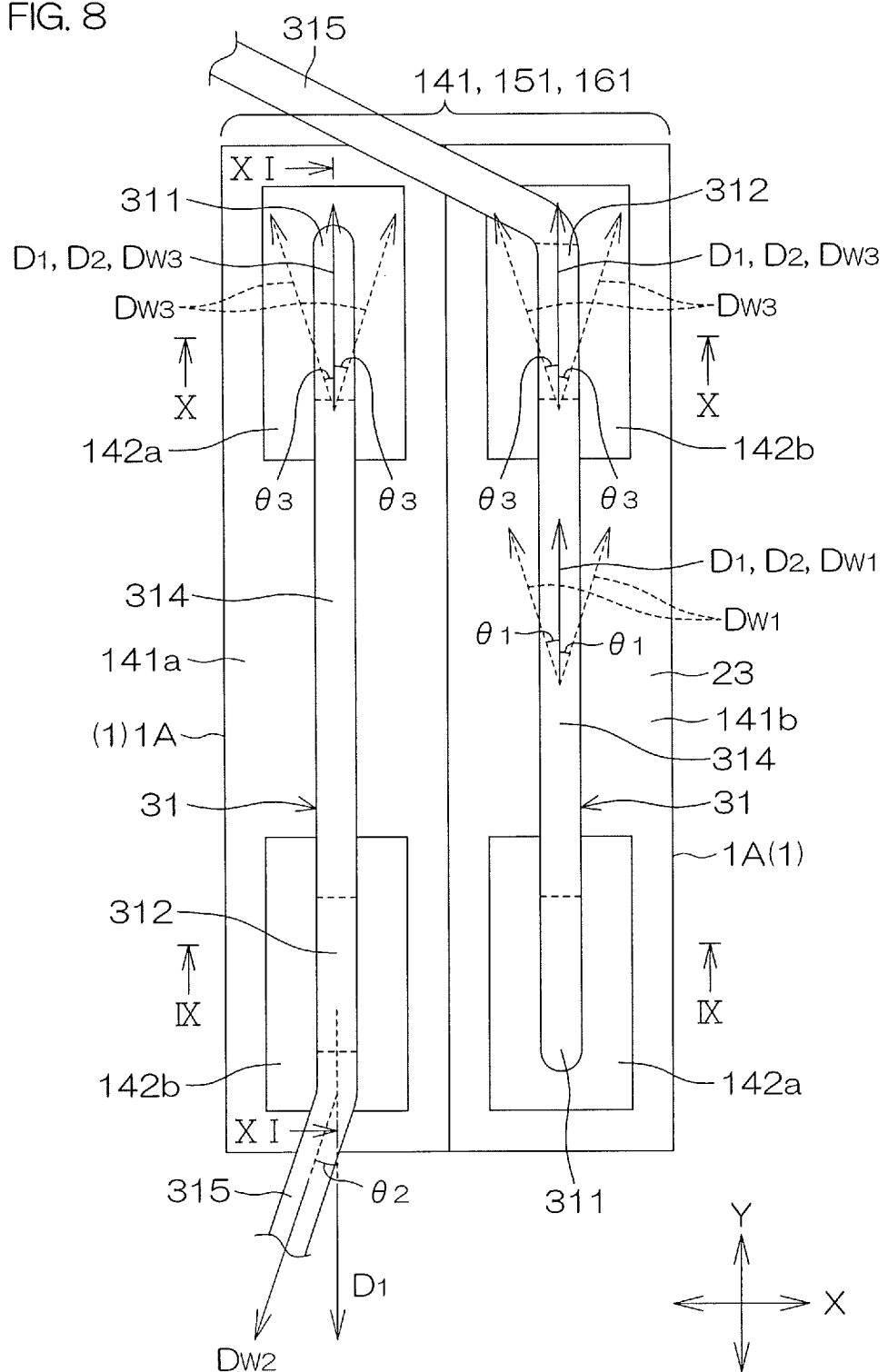
FIG. 8 is an enlarged view of a principal portion in which a portion of FIG. 4 is enlarged.
Figure 9:
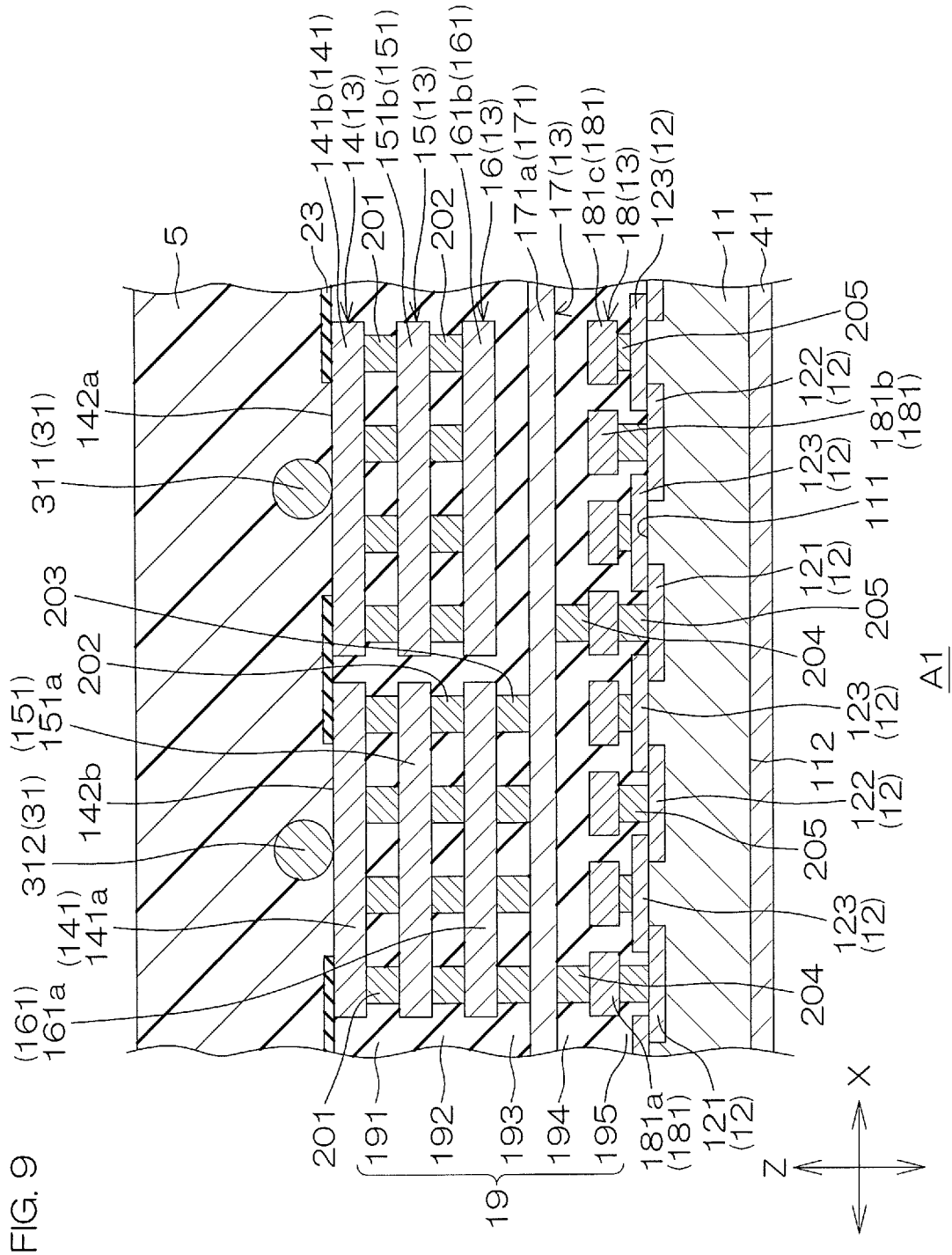
FIG. 9 is a sectional view taken along line IX-IX of FIG. 8.
Figure 10:
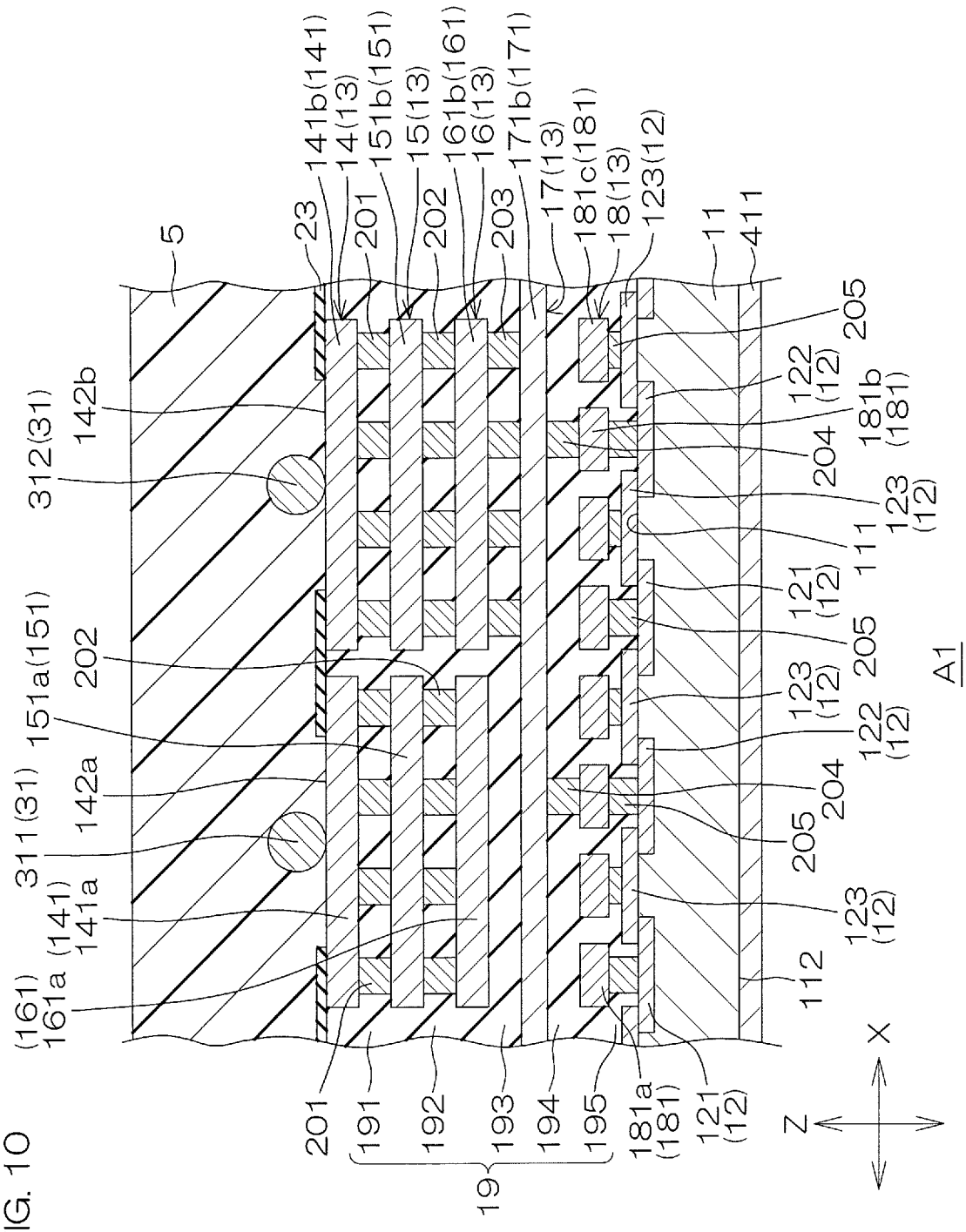
FIG. 10 is a sectional view taken along line X-X of FIG. 8.

FIG. 7B is an enlarged plan view of principal portions of first via portions 201a of FIG. 7A. FIG. 7C is an enlarged plan view of principal portions of second via portions 202a of FIG. 7A. Here, in FIG. 7B and FIG. 7C, size ratios among constituent elements differ from those in FIG. 7A for convenience of description. FIG. 8 is an enlarged plan view of a principal portion in which a portion of the plan view shown in FIG. 4 is enlarged. FIG. 9 is a sectional view taken along line IX-IX of FIG. 8. FIG. 10 is a sectional view taken along line X-X of FIG. 8. FIG. 11 is a sectional view taken along line XI-XI of FIG. 8.

The semiconductor substrate 11 is formed of a semiconductor material. As the semiconductor material, for example, Si (silicon), SiC (silicon carbide), GaN (gallium nitride), etc., can be cited. In this preferred embodiment, one (the first semiconductor element 1A) of the two first semiconductor elements 1 may be an n type channel MOSFET and the other (the first semiconductor element 1B) of the two first semiconductor elements 1 may be a p type channel MOSFET. As shown in FIG. 9 to FIG. 11, the semiconductor substrate 11 may have a substrate principal surface 111 and a substrate rear surface 112 that face opposite sides with respect to each other in the Z direction.

As shown in FIG. 9 to FIG. 11, the plurality of element electrodes 12 are formed such as to be exposed from the substrate principal surface 111 of the semiconductor substrate 11. In this preferred embodiment, each of the first semiconductor elements 1 includes first electrodes 121, second electrodes 122, and third electrodes 123 as the plurality of element electrodes 12. In this preferred embodiment, the first electrodes 121 may be source electrodes, the second electrodes 122 may be drain electrodes, and the third electrodes 123 may be gate electrodes. A configuration of the first electrodes 121, the second electrodes 122, and the third electrodes 123 in plan view is not restricted in particular and respective element electrodes 12 of rectangular shape may be arrayed in a lattice or may be aligned in a row in the X direction or the Y direction. Also, in this preferred embodiment, each first electrode 121 and each second electrode 122 may respectively be an example of a "first element electrode" and a "second element electrode" described in the Claims.

The first electrodes 121 and the second electrodes 122 are formed in the substrate principal surface 111 such as to sandwich the third electrodes 123. A region in the substrate principal surface 111 below each third electrode 123 is a channel region in which a channel is formed when an appropriate voltage is applied to the third electrode 123. When an appropriate voltage is applied to the third electrode 123, a channel current flows between the first electrode 121 and the second electrode 122 that are aligned in a lateral direction along the substrate principal surface 111.

As shown in FIG. 9 to FIG. 11, the wiring layer 13 is formed on the substrate principal surface 111 of the semiconductor substrate 11 and is in conduction with the plurality of element electrodes 12. The wiring layers 13 each include a first conductive layer 14, a second conductive layer 15, a third conductive layer 16, a fourth conductive layer 17, and a fifth conductive layer 18 that are separated from each other in the Z direction, with respect to the respective first semiconductor elements 1. The number of the abovementioned conductive layers in each wiring layer 13 is not restricted to the abovementioned five. The first conductive layer 14, the second conductive layer 15, the third conductive layer 16, the fourth conductive layer 17, and the fifth conductive layer 18 are insulated from each other by the insulating layer 19.

As shown in FIG. 9 to FIG. 11, the first conductive layer 14 is an outer layer of the wiring layer 13 and is disposed at a position further from the substrate principal surface 111 than the second conductive layer 15, the third conductive layer 16, the fourth conductive layer 17, and the fifth conductive layer 18. The first conductive layer 14 includes a plurality of first plate members 141.

The plurality of first plate members 141 are each constituted of a conductive material. The conductive material may, for example, be a material having Al (aluminum) and Cu (copper) as main components but is not restricted in particular. In this preferred embodiment, the raw material of each first plate member 141 is a material having Al as a main component and is preferably an Al-based alloy and more preferably an Al—Cu-based alloy, an Al—Si-based alloy, or an Al—Si—Cu-based alloy combining the above that contains Al at a ratio of not less than 90 wt %.

Each first plate member 141 has a rectangular shape with a long direction oriented along the Y direction in plan view. A width (dimension in a short direction) of each first plate member 141 is, for example, approximately 350 μm. Also, a thickness (Z-direction dimension) of each first plate member 141 (a first pad portion 142a and a second pad portion 142b to be described below) is, for example, 1.6 μm to 6.0 μm. If the thickness of the first pad portion 142a and the second pad portion 142b is 1.6 μm to 6.0 μm, forces that are applied to the first pad portion 142a and the second pad portion 142b during joining of the first conductive members 31 can be made less likely to be transmitted to the insulating layer 19. Consequently, forming of a crack in the insulating layer 19 can be suppressed.

The plurality of first plate members 141 are aligned in the X direction in plan view. Here, although for convenience of understanding, the first plate members 141 that are adjacent in the X direction are illustrated such to contact each other in FIG. 4, the insulating layer 19 is interposed between the adjacent first plate members 141. Therefore, in the first conductive layer 14, the plurality of first plate members 141 are insulated from each other by the insulating layer 19.

As shown in FIG. 7A and FIG. 8 to FIG. 11, each first plate member 141 includes the first pad portion 142a and the second pad portion 142b that are each exposed from the protective layer 23. The first pad portions 142a and the second pad portions 142b are provided with hatching in FIG. 7A for convenience of understanding. In this preferred embodiment, the first pad portions 142a and the second pad portions 142b may each be an example of a "pad portion" described in the Claims.

The first pad portions 142a and the second pad portions 142b are disposed in the same planes of the respective first plate members 141. In each first plate member 141, the first pad portion 142a and the second pad portion 142b are separated from each other and are aligned in the Y direction. One end (a joint portion 311 to be described below) of a first conductive member 31 is joined to the first pad portion 142a. An intermediate portion (a joint portion 312 to be described below) of the first conductive member 31 is joined to the second pad portion 142b.

As shown in FIG. 9 to FIG. 11, the second conductive layer 15 is an intermediate layer of the wiring layer 13 and is disposed between the first conductive layer 14 and the third conductive layer 16. The second conductive layer 15 includes a plurality of second plate members 151. In this preferred embodiment, each second plate member 151 may be an example of a "first wiring layer" described in the Claims.

The plurality of second plate members 151 are each constituted of a conductive material. The conductive material may, for example, be a material having Al (aluminum) and Cu (copper) as main components but is not restricted in particular. In this preferred embodiment, the raw material of each second plate member 151 is a material having Al as a main component and is preferably an Al-based alloy and more preferably an Al—Cu-based alloy, an Al—Si-based alloy, or an Al—Si—Cu-based alloy combining the above that contains Al at a ratio of not less than 90 wt %.

Each second plate member 151 has a rectangular shape with a long direction $D_1$ oriented along the Y direction in plan view. In this preferred embodiment, the direction $D_1$ may be an example of a "first direction" described in the Claims. Each second plate member 151 is formed of a solid pattern below a first plate member 141. For example, the second plate member 151 may be formed such as to cover an entire surface of a region below the first plate member 141 (a region overlapping with the first plate member 141 in plan view), may be formed without being divided in the region below the first plate member 141, or may be formed without gaps in the region below the first plate member 141. As another expression, each second plate member 151 may be formed to substantially the same shape as each first plate member 141 in plan view.

A width (dimension in a short direction) of each second plate member 151 is, for example, approximately 350 μm. Also, a thickness (Z-direction dimension) of each second plate member 151 is, for example, approximately 0.5 μm. The plurality of second plate members 151 are aligned in the X direction in plan view and the insulating layer 19 is interposed between the second plate members 151 that are adjacent in the X direction. Therefore, in the second conductive layer 15, the plurality of second plate members 151 are insulated from each other by the insulating layer 19.

As shown in FIG. 9 to FIG. 11, the third conductive layer 16 is an intermediate layer of the wiring layer 13 and is disposed between the second conductive layer 15 and the fourth conductive layer 17. The third conductive layer 16 includes a plurality of third plate members 161. In this preferred embodiment, each third plate member 161 may be an example of a "third wiring layer" described in the Claims.

The plurality of third plate members 161 are each constituted of a conductive material. The conductive material may, for example, be a material having Al (aluminum) and Cu (copper) as main components but is not restricted in particular. In this preferred embodiment, the raw material of each third plate member 161 is a material having Al as a main component and is preferably an Al-based alloy and more preferably an Al—Cu-based alloy, an Al—Si-based alloy, or an Al—Si—Cu-based alloy combining the above that contains Al at a ratio of not less than 90 wt %.

Each third plate member 161 has a rectangular shape with a long direction $D_2$ oriented along the Y direction in plan view. In this preferred embodiment, the direction $D_2$ may be an example of a "second direction" described in the Claims. Each third plate member 161 is formed of a solid pattern below a second plate member 151. For example, the third plate member 161 may be formed such as to cover an entire surface of a region below the second plate member 151 (a region overlapping with the second plate member 151 in plan view), may be formed without being divided in the region below the second plate member 151, or may be formed without gaps in the region below the second plate member 151. As another expression, each third plate member 161 may be formed to substantially the same shape as each second plate member 151 in plan view.

A width (dimension in a short direction) of each third plate member 161 is, for example, approximately 350 μm. Also, a thickness (Z-direction dimension) of each third plate member 161 is, for example, approximately 0.5 μm. The plurality of third plate members 161 are aligned in the X direction in plan view and the insulating layer 19 is interposed between the third plate members 161 that are adjacent in the X direction. Therefore, in the third conductive layer 16, the plurality of third plate members 161 are insulated from each other by the insulating layer 19.

As shown in FIG. 9 to FIG. 11, the fourth conductive layer 17 is an intermediate layer of the wiring layer 13 and is disposed between the third conductive layer 16 and the fifth conductive layer 18. The fourth conductive layer 17 includes a plurality of fourth plate members 171.

The plurality of fourth plate members 171 are each constituted of a conductive material. The conductive material may, for example, be a material having Al (aluminum) and Cu (copper) as main components but is not restricted in particular. In this preferred embodiment, the raw material of each fourth plate member 171 is a material having Al as a main component and is preferably an Al-based alloy and more preferably an Al—Cu-based alloy, an Al—Si-based alloy, or an Al—Si—Cu-based alloy combining the above that contains Al at a ratio of not less than 90 wt %.

Each fourth plate member 171 has a rectangular shape with a long direction oriented along the X direction in plan view. That is, each fourth plate member 171 is orthogonal to the first plate members 141, the second plate members 151, and the third plate members 161 in plan view. A width (dimension in a short direction) of each fourth plate member 171 may, for example, be narrower in comparison to the first plate members 141, the second plate members 151, and the third plate members 161 and is, for example, approximately 20 μm to 50 μm. Also, a thickness (Z-direction dimension) of each fourth plate member 171 is, for example, approximately 0.5 μm. The plurality of fourth plate members 171 are aligned in the Y direction in plan view and the insulating layer 19 is interposed between the fourth plate members 171 that are adjacent in the Y direction. Therefore, in the fourth conductive layer 17, the plurality of fourth plate members 171 are insulated from each other by the insulating layer 19.

As shown in FIG. 9 to FIG. 11, the fifth conductive layer 18 is an inner layer of the wiring layer 13 and is disposed at a position closer to the substrate principal surface 111 than the first conductive layer 14, the second conductive layer 15, the third conductive layer 16, and the fourth conductive layer 17. The fifth conductive layer 18 includes a plurality of fifth plate members 181.

The plurality of fifth plate members 181 are each constituted of a conductive material. The conductive material may, for example, be a material having Al (aluminum) and Cu (copper) as main components but is not restricted in particular. In this preferred embodiment, the raw material of each fifth plate member 181 is a material having Al as a main component and is preferably an Al-based alloy and more preferably an Al—Cu-based alloy, an Al—Si-based alloy, or an Al—Si—Cu-based alloy combining the above that contains Al at a ratio of not less than 90 wt %.

Each fifth plate member 181 has a rectangular shape with a long direction oriented along the Y direction in plan view. A width (dimension in a short direction) of each fifth plate member 181 may, for example, be narrower in comparison to the first plate members 141, the second plate members 151, the third plate members 161, and the fourth plate members 171 and is, for example, approximately 1.0 μm. Also, a thickness (Z-direction dimension) of each fifth plate member 181 is, for example, approximately 0.5 μm. The plurality of fifth plate members 181 are aligned in the X direction in plan view and the insulating layer 19 is interposed between the fifth plate members 181 that are adjacent in the X direction. Therefore, in the fifth conductive layer 18, the plurality of fifth plate members 181 are insulated from each other by the insulating layer 19. In this preferred embodiment, the plurality of fifth plate members 181 are aligned in the X direction at a pitch of approximately 0.6 μm.

In the wiring layer 13, the numbers of the first plate members 141, the second plate members 151, and the third plate members 161 are the same as each other and the numbers of the first plate members 141, the second plate members 151, and the third plate members 161 are less than the number of the fourth plate members 171 and the number of the fourth plate members 171 is less than the number of the fifth plate members 181. Also, the number of the fifth plate members 181 is less than the number of the element electrodes 12. In the wiring layer 13, the fifth conductive layer 18 and the fourth conductive layer 17 make the plurality of element electrodes 12 is in conduction with the first to third conductive layers 14 to 16 at upper layers while consolidating them.

As shown in FIG. 7A, in the wiring layer 13, the long directions of the respective first plate members 141, second plate members 151, and third plate members 161 and the long direction of the respective fourth plate members 171 are orthogonal on a plane (x-y plane) orthogonal to the Z direction and the long direction of the respective fourth plate members 171 and the long direction of the respective fifth plate members 181 are orthogonal on the x-y plane.

In the wiring layer 13, the plurality of first plate members 141 include first electrode conductive members 141a that are in conduction with the first electrodes 121 and second electrode conductive members 141b that are in conduction with the second electrodes 122. The first electrode conductive members 141a and the second electrode conductive members 141b are aligned alternately in the X direction.

The first conductive layer 14 may include, for example as shown in FIG. 4, two first electrode conductive members 141a that are in conduction with the first electrodes 121 of the first semiconductor element 1A and two first electrode conductive members 141a that are in conduction with the first electrodes 121 of the first semiconductor element 1B. Also, the first conductive layer 14 may include one second electrode conductive member 141b that is in conduction with the second electrodes 122 of the first semiconductor element 1A and one second electrode conductive member 141b that is in conduction with the second electrodes 122 of the first semiconductor element 1B.

Similarly, the plurality of second plate members 151 include first electrode conductive members 151a that are in conduction with the first electrodes 121 and second electrode conductive members 151b that are in conduction with the second electrodes 122. The first electrode conductive members 151a and the second electrode conductive members 151b are aligned alternately in the X direction. In this preferred embodiment, each first electrode conductive members 151a and each second electrode conductive members 151b may respectively be an example of a "first wiring layer" and a "second wiring layer" described in the Claims.

Also, the plurality of third plate members 161 include first electrode conductive members 161a that are in conduction with the first electrodes 121 and second electrode conductive members 161b that are in conduction with the second electrodes 122. The first electrode conductive members 161a and the second electrode conductive members 161b are aligned alternately in the X direction.

Also, the plurality of fourth plate members 171 include first electrode conductive members 171a that are in conduction with the first electrodes 121 and second electrode conductive members 171b that are in conduction with the second electrodes 122. The first electrode conductive members 171a and the second electrode conductive members 171b are aligned alternately in the Y direction.

Also, the plurality of fifth plate members 181 include first electrode conductive members 181a that are in conduction with the first electrodes 121 and second electrode conductive members 181b that are in conduction with the second electrodes 122. Further, the plurality of fifth plate members 181 include third electrode conductive members 181c that are in conduction with the third electrodes 123. Each third electrode conductive member 181c is disposed between a first electrode conductive member 181a and a second electrode conductive member 181b that are adjacent.

As shown in FIG. 9 to FIG. 11, the insulating layer 19 is formed between the first conductive layer 14 and the semiconductor substrate 11 (substrate principal surface 111). The raw material of the insulating layer 19 is not restricted in particular as long as it has an insulating property and is constituted, for example, of $SiO_2$. The insulating layer 19 includes a first interlayer insulating film 191, a second interlayer insulating film 192, a third interlayer insulating film 193, a fourth interlayer insulating film 194, and a fifth interlayer insulating film 195. In this preferred embodiment, the first interlayer insulating film 191 may be an example of an "insulating layer" described in the Claims.

The first interlayer insulating film 191 is interposed between the first conductive layer 14 and the second conductive layer 15 and insulates these. The second interlayer insulating film 192 is interposed between the second conductive layer 15 and the third conductive layer 16 and insulates these. The third interlayer insulating film 193 is interposed between the third conductive layer 16 and the fourth conductive layer 17 and insulates these. The fourth interlayer insulating film 194 is interposed between the fourth conductive layer 17 and the fifth conductive layer 18 and insulates these. The fifth interlayer insulating film 195 is interposed between the fifth conductive layer 18 and the semiconductor substrate 11 (substrate principal surface 111) and insulates the fifth conductive layer 18 and the respective element electrodes 12.

Also, the insulating layer 19 is also formed respectively between the first plate members 141 that are adjacent in the X direction in the first conductive layer 14, between the second plate members 151 that are adjacent in the X direction in the second conductive layer 15, between the third plate members 161 that are adjacent in the X direction in the third conductive layer 16, between the fourth plate members 171 that are adjacent in the Y direction in the fourth conductive layer 17, and between the fifth plate members 181 that are adjacent in the X direction in the fifth conductive layer 18. Here, in FIG. 7A, the insulating layer 19 interposed in these intervals are omitted.

Each of the plurality of vias 20 is constituted of a penetrating hole that penetrates through the insulating layer 19 and a conductive material filled in the penetrating hole. In this preferred embodiment, the conductive material is, for example, W (tungsten). Here, the raw material of each via 20 is not restricted thereto and may be aluminum, copper, etc. Also, the conductive material may be formed such as to cover an inner surface of the penetrating hole instead of being filled in the abovementioned penetrating hole.

Each via 20 extends along the Z direction. In this preferred embodiment, a plan view shape of each via 20 is a circular shape as shown in FIG. 7A. Here, the plan view shape of each via 20 is not restricted thereto and may instead be a rectangular shape, a polygonal shape, etc. In this preferred embodiment, the plurality of vias 20 include a plurality of first vias 201, a plurality of second vias 202, a plurality of third vias 203, a plurality of fourth vias 204, and a plurality of fifth vias 205.

As shown in FIG. 7A, FIG. 7B, and FIG. 9 to FIG. 11, each of the plurality of first vias 201 penetrates through the first interlayer insulating film 191 and is interposed between the first conductive layer 14 and the second conductive layer 15. Each first via 201 brings the first conductive layer 14 and the second conductive layer 15 into conduction. As shown in FIG. 7A and FIG. 7B, the plurality of first vias 201 are arrayed such as to form first via portions 201a of solid pattern below the first plate members 141.

More specifically, as shown in FIG. 7B, the first via portions 201a are portions that, due to the plurality of first vias 201 being gathered and formed in fixed regions, are visually distinguishable from portions (non-first-via portions 201b) of the first interlayer insulating film 191 in peripheries of the first via portions 201a.

In this preferred embodiment, as indicated by broken line hatching in FIG. 7B, lower regions 143 (regions of the first interlayer insulating film 191 overlapping with the first plate members 141 in plan view) below the first plate members 141 are set in the first interlayer insulating film 191 and these lower regions 143 are formed as the first via portions 201a. In the first via portions 201a, for example, the plurality of first vias 201 of circular plan view shape are concentratedly arrayed regularly and uniformly (for example, in a matrix). Here, that the first vias 201 are concentrated may indicate, for example, a mode where the plurality of first vias 201 are gathered with there being an interval of not more than a width (a diameter in this preferred embodiment) of each first via 201 or approximately equal to the width between adjacent first vias 201. The regions of band shape having a fixed width that are occupied by the plurality of first vias 201 are thereby defined as the first via portions 201a.

In other words, that "the first via portions 201a are of solid pattern below the first plate members 141" may indicate that each first via portion 201a of band shape is formed such as to cover an entire surface of the lower region 143 below a first plate member 141, is formed without being divided in the lower region 143 below the first plate member 141, or is formed without gaps in the lower region 143 below the first plate member 141. As another expression, the above may indicate that each first via portion 201a is formed to substantially the same shape as each first plate member 141 in plan view.

The first via portions 201a are formed in plurality in one-to-one correspondence with the plurality of first plate members 141 and are aligned in the X direction. Regions of the first interlayer insulating film 191 between adjacent first via portions 201a are the non-first-via portions 201b. The first via portions 201a and the non-first-via portions 201b are thereby aligned alternately in the X direction.

In this preferred embodiment, each non-first-via portion 201b is defined as a band-shaped region of the first interlayer insulating film 191 extending along the Y direction and having a fixed width. The non-first-via portion 201b may, in an x-y plane, be a band-shaped blank region in which the first vias 201 are not formed and the width thereof may, for example, be not less than several times the width of each first via 201.

Although each boundary portion 144 between a first via portion 201a and a non-first-via portion 201b is indicated by a rectilinear broken line in FIG. 7B, it does not have to be of a clearly rectilinear shape in actuality. For example, when an upper surface of the first interlayer insulating film 191 is visually observed, for example, via an SEM image, etc., a vague boundary portion between a plurality of first vias 201 that are aligned in a line along the Y direction at an outermost side of a first via portion 201a and a blank region of the interlayer insulating film 191 adjacent thereto may be defined as the boundary portion 144.

As shown in FIG. 7A, FIG. 7C, and FIG. 9 to FIG. 11, each of the plurality of second vias 202 penetrates through the second interlayer insulating film 192 and is interposed between the second conductive layer 15 and the third conductive layer 16. Each second via 202 brings the second conductive layer 15 and the third conductive layer 16 into conduction. As shown in FIG. 7A and FIG. 7C, the plurality of second vias 202 are arrayed such as to form second via portions 202a of solid pattern below the second plate members 151.

More specifically, as shown in FIG. 7C, the second via portions 202a are portions that, due to the plurality of second vias 202 being gathered and formed in fixed regions, are visually distinguishable from portions (non-second-via portions 202b) of the second interlayer insulating film 192 in peripheries of the second via portions 202a.

In this preferred embodiment, as indicated by broken line hatching in FIG. 7C, lower regions 153 (regions of the second interlayer insulating film 192 overlapping with the second plate members 151 in plan view) below the second plate members 151 are set in the second interlayer insulating film 192 and these lower regions 153 are formed as the second via portions 202*a*. In the second via portions 202*a*, for example, the plurality of second vias 202 of circular plan view shape are concentratedly arrayed regularly and uniformly (for example, in a matrix). Here, that the second vias 202 are concentrated may indicate, for example, a mode where the plurality of second vias 202 are gathered with there being an interval of not more than a width (a diameter in this preferred embodiment) of each second via 202 or approximately equal to the width between adjacent second vias 202. Regions of band shape having a fixed width that are occupied by the plurality of second vias 202 are thereby defined as the second via portions 202*a*.

In other words, that "the second via portions 202*a* are of solid pattern below the second plate members 151" may indicate that each second via portion 202*a* of band shape is formed such as to cover an entire surface of the lower region 153 below a second plate member 151, is formed without being divided in the lower region 153 below the second plate member 151, or is formed without gaps in the lower region 153 below the second plate member 151. As another expression, the above may indicate that each second via portion 202*a* is formed to substantially the same shape as each second plate member 151 in plan view.

The second via portions 202*a* are formed in plurality in one-to-one correspondence with the plurality of second plate members 151 and are aligned in the X direction. Regions of the second interlayer insulating film 192 between adjacent second via portions 202*a* are the non-second-via portions 202*b*. The second via portions 202*a* and the non-second-via portions 202*b* are thereby aligned alternately in the X direction.

In this preferred embodiment, each non-second-via portion 202*b* is defined as a band-shaped region of the second interlayer insulating film 192 extending along the Y direction and having a fixed width. The non-second-via portion 202*b* may, in an x-y plane, be a band-shaped blank region in which the second vias 202 are not formed and the width thereof may, for example, be not less than several times the width of each second via 202.

Although each boundary portion 154 between a second via portion 202*a* and a non-second-via portion 202*b* is indicated by a rectilinear broken line in FIG. 7B, it does not have to be of a clearly rectilinear shape in actuality. For example, when an upper surface of the second interlayer insulating film 192 is visually observed, for example, via an SEM image, etc., a vague boundary portion between a plurality of second vias 202 that are aligned in a line along the Y direction at an outermost side of a second via portion 202*a* and a blank region of the interlayer insulating film 192 adjacent thereto may be defined as the boundary portion 154.

As shown in FIG. 7A and FIG. 9 to FIG. 11, each of the plurality of third vias 203 penetrates through the third interlayer insulating film 193 and is interposed between the third conductive layer 16 and the fourth conductive layer 17. Each third via 203 brings the third conductive layer 16 and the fourth conductive layer 17 into conduction. The arrangement of the plurality of third vias 203 is not restricted in particular and should be designed appropriately based on positioning of the plurality of third plate members 161 of the third conductive layer 16 and the plurality of fourth plate members 171.

As shown in FIG. 7A and FIG. 9 to FIG. 11, each of the plurality of fourth vias 204 penetrates through the fourth interlayer insulating film 194 and is interposed between the fourth conductive layer 17 and the fifth conductive layer 18. Each fourth via 204 brings the fourth conductive layer 17 and the fifth conductive layer 18 into conduction. The arrangement of the plurality of fourth vias 204 is not restricted in particular and should be designed appropriately based on positioning of the plurality of fourth plate members 171 of the fourth conductive layer 17 and the plurality of fifth plate members 181.

As shown in FIG. 7A and FIG. 9 to FIG. 11, each of the plurality of fifth vias 205 penetrates through the fifth interlayer insulating film 195 and is interposed between the fifth conductive layer 18 and the element electrodes 12. Each fifth via 205 brings the fifth conductive layer 18 and the element electrodes 12 into conduction. The arrangement of the plurality of fifth vias 205 is not restricted in particular and should be designed appropriately based on positioning of the plurality of fifth plate members 181 of the fifth conductive layer 18 and the plurality of element electrodes 12.

As shown in FIG. 9 to FIG. 11, the protective layer 23 is formed such as to cover an upper surface of the wiring layer 13 (first conductive layer 14). The protective layer 23 may, for example, be an $Si_3N_4$ layer or $SiO_2$ layer formed by a plasma CVD method or a polyimide resin layer that is formed by coating. It may also be that which is formed by a combination of these. In this preferred embodiment, portions of the protective layer 23 are open and the first pad portions 142*a* and the second pad portions 142*b* are respectively exposed from the opened portions.

The second semiconductor element 2 has an element principal surface 21 and an element rear surface 22 that face opposite sides with respect to each other in the Z direction. The element principal surface 21 faces the same direction as the substrate principal surface 111 of the semiconductor substrate 11. The element rear surface 22 faces the same direction as the substrate rear surface 112 of the semiconductor substrate 11. As shown in FIG. 4, the second semiconductor element 2 has a plurality of pad portions 211 formed on the element principal surface 21. The pad portions 211 are portions at which the second conductive members 32 are joined.

Each of the plurality of first conductive members 31 brings one of the plurality of first semiconductor elements 1 and the lead frame 4 into conduction. Each first conductive member 31 intersects an outer periphery of one of the plurality of first semiconductor elements 1 in plan view. Each first conductive member 31 includes a joint portion 311 that is joined to a first pad portion 142*a* of the plurality of first semiconductor elements 1, a joint portion 312 that is joined to a second pad portion 142*b* of the plurality of first semiconductor elements 1, and a joint portion 313 that is joined to a portion (a bonding pad portion 42 to be described below) of the lead frame 4.

Each first conductive member 31 is formed using, for example, a wedge tool (a wedge tool 503 to be described below) and the joint portions 311, 312, and 313 are formed by wedge bonding by the wedge tool. As shown in FIG. 8, each joint portion 311 has a substantially rectangular shape with which a long direction is oriented along the Y direction. Here, long direction dimensions of the joint portions 311, 312, and 313 depend on the wedge tool used. In this preferred embodiment, the joint portions 311 and 312 may each be an example of a "joint portion of the conductive member" described in the Claims.

Also, as shown in FIG. 8, each first conductive member 31 may have a connecting portion 314 that extends from a first pad portion 142*a* to a second pad portion 142*b* and connects the first pad portion 142*a* and the second pad portion 142*b*. The connecting portion 314 is a portion of the first conductive member 31 that is installed as a bridge between the first pad portion 142*a* and the second pad portion 142*b* and may thus be called a bridge portion of the first conductive member 31.

An entirety of the connecting portion 314 of the first conductive member 31 overlaps with one of the plurality of first semiconductor elements 1 in plan view. The connecting portion 314 of each first conductive member 31 thus does not intersect the outer periphery of any of the plurality of first semiconductor elements 1 in plan view. The connecting portion 314 of each first conductive member 31 is formed as a line along the long direction (Y direction) of a first plate member 141. In this preferred embodiment, a direction $D_{W1}$ in which the connecting portions 314 of the first conductive members 31 extend is parallel to the direction $D_1$ (Y direction) in which the second plate members 151 extend. That is, an angle between the direction $D_{W1}$ and the direction $D_1$ in plan view is 0°. Here, the direction $D_{W1}$ in which the connecting portion 314 of each first conductive member 31 extends may be such that an angle $\theta_1$ with respect to the direction $D_1$ is in a range of −30° to 30° as indicated by broken lines in FIG. 8. In this preferred embodiment, the direction $D_{W1}$ may be an example of a "first direction" as described in [B9] below.

Here, in FIG. 8, the second plate members 151 and the third plate members 161 cannot be recognized visually due to being formed below the first plate members 141. However, the second plate members 151 and the third plate members 161 are each formed of a solid pattern with respect to the first plate members 141. The shapes of the second plate members 151 and the third plate members 161 may thus be regarded as being the same as the shape of the first plate members 141.

Also, each first conductive member 31 may include an extension portion 315 that extends outward of each first semiconductor element 1 from a second pad portion 142*b*. The extension portion 315 of each first conductive member 31 intersects with the outer periphery of one of the plurality of first semiconductor elements 1 in plan view. The extension portion 315 of each first conductive member 31 is formed as a line along a direction $D_{W2}$ that forms an angle $\theta_2$ of −30° to 30° with respect to the long direction $D_1$ (Y direction) of the second plate members 151.

Such ranges of the angles $\theta_1$ between the direction $D_{W1}$ and the direction $D_1$ and the angles $\theta_2$ between the direction $D_{W2}$ and the direction $D_1$ may be applied to relationships of directionalities of the joint portions 311 and 312 and a directionality of the second plate members 151. As mentioned above, the respective joint portions 311 and 312 are formed by wedge bonding and are formed to elongate shapes that are long in one direction $D_{W3}$ (Y direction) in plan view. In other words, the respective joint portions 311 and 312 have shapes that extend selectively in the one direction $D_{W3}$. And in this preferred embodiment, angles $\theta_3$ of the long directions $D_{W3}$ of the respective joint portions 311 and 312 with respect to the long direction $D_1$ (Y direction) of the second plate members 151 may also be in a range of −30° to 30° as indicated by broken lines in FIG. 8.

Here, not all of the angles $\theta_1$, $\theta_2$, and $\theta_3$ are required to be in the range of −30° to 30° with respect to the long direction $D_1$ of the second plate members 151. For example, some of the angles $\theta_1$ and angles $\theta_3$ may be in the range of −30° to 30° with respect to the long direction $D_1$ while some of the angles $\theta_2$ may be outside the range of −30° to 30° with respect to the long direction $D_1$.

Each of the plurality of second conductive members 32 achieves conduction between a third electrode 123 of a first semiconductor element 1 and the lead frame 4 and between the second semiconductor element 2 and the lead frame 4. Each second conductive member 32 intersects the outer periphery of a first semiconductor element 1 or of the second semiconductor element 2 in plan view.

In this preferred embodiment, the respective first conductive members 31 and the respective second conductive members 32 are all so-called bonding wires and are linear members having a cross section of circular shape. Here, these are not restricted to linear members and may be strip members called ribbon wires instead. The raw material of the linear members has Al as a main component. That is, in this preferred embodiment, the respective first conductive members 31 and the respective second conductive members 32 are all Al wires. Here, the raw material of the respective first conductive members 31 and the respective second conductive members 32 is not restricted thereto and may be Cu or Au, etc. Also, in this preferred embodiment, the first conductive members 31 and the second conductive members 32 may all be $\phi$100 µm to 600 µm in thickness (wire diameter).

The lead frame 4 is a portion that constitutes conduction paths of the plurality of first semiconductor elements 1 and the second semiconductor element 2 with respect to the circuit board on which the semiconductor device A1 is mounted. The lead frame 4 supports the plurality of first semiconductor elements 1 and the second semiconductor element 2 and are in conduction with the plurality of first semiconductor elements 1 and the second semiconductor element 2. The lead frame 4 is formed from a thin metal plate of Cu, etc., of rectangular shape in plan view by punching, cutting-off, bending, etc. Therefore, the raw material of the lead frame 4 has Cu as a main component. Here, the raw material of the lead frame 4 is not restricted thereto.

The lead frame 4 includes a die pad portion 41, a plurality of bonding pad portions 42*a*, 42*b*, 42*c*, 42*d*, and 42*e*, a plurality of lead portions 43*a*, 43*b*, 43*c*, 43*d*, 43*e*, and 43*f*, and a plurality of side extension portions 44. Here, for convenience of description, the plurality of bonding pad portions 42*a* to 42*e* shall be described as bonding pad portions 42 when these are not distinguished in particular. Also, similarly, the plurality of lead portions 43*a* to 43*f* shall be described as lead portions 43 when these are not distinguished in particular.

The die pad portion 41 is a portion on which the plurality of first semiconductor elements 1 and the second semiconductor element 2 are mounted. The plurality of first semiconductor elements 1 and the second semiconductor element 2 are joined to the die pad portion 41 by a joining material 411. The joining material 411 is, for example, solder paste, Ag paste, etc. The raw material of the joining material 411 is not restricted in particular.

Each of the plurality of bonding pad portions 42*a* to 42*e* is a portion to which either of the first conductive members 31 and the second conductive members 32 is joined. The respective bonding pad portions 42*a* to 42*e* are disposed apart from each other. Also, in this preferred embodiment, the respective bonding pad portions 42*a* to 42*e* are disposed apart from the die pad portion 41. One of any of the plurality of bonding pad portions 42*a* to 42*e* may be formed integral to the die pad portion 41. In this case, the lead frame 4 does not have to include the plurality of side extension portions 44.

In this preferred embodiment, the respective bonding pad portions 42*a* and 42*b* have projecting portions 421*a* and 421b projecting from an end edge at one side in the X direction. The projecting portions 421a and 421b respectively overlap with the lead portion 43f when viewed in the Y direction. The bonding pad portion 42c is of rectangular shape in plan view and respective end edges in the X direction of the respective bonding pad portions 42d and 42e are recessed.

The bonding pad portions 42a and 42b are in conduction with the respective first electrodes 121 of the respective first semiconductor elements 1A and 1B via first conductive members 31. Two each of the lead portions 43a and 43b are connected respectively to the bonding pad portions 42a and 42b.

The bonding pad portion 42c is in conduction with the respective second electrodes 122 of the respective first semiconductor elements 1A and 1B via first conductive members 31. Three lead portions 43c are connected to the bonding pad portion 42c.

The respective bonding pad portions 42d and 42e are of the same size as each other. The respective bonding pad portions 42d are in conduction with the second semiconductor element 2 via second conductive members 32. The respective bonding pad portions 42e are in conduction with the third electrodes 123 of the first semiconductor elements 1 via second conductive members 32.

The lead portion 43f is not connected to any of the bonding pad portions 42a to 42e and is not in conduction with any of the plurality of first semiconductor elements 1 and the second semiconductor element 2. As shown in FIG. 4, the lead portion 43f is disposed between the lead portion 43a and the lead portion 43b that are adjacent in the X direction. In this preferred embodiment, the two lead portions 43a and the two lead portions 43b are disposed at opposite side sandwiching the lead portion 43f in the X direction. Also, although with the lead portion 43f shown in FIG. 4, a width of a portion covered by the sealing resin 5 is greater than a width of a portion exposed from the sealing resin 5, it may instead be equal thereto or may be less therethan. However, by making it greater as shown in FIG. 4, dropping off of the lead portion 43f from the sealing resin 5 can be suppressed.

Each of the plurality of lead portions 43a to 43d is a portion connected to one of the bonding pad portions 42a to 42d and extending from that bonding portion among 42a to 42d as shown in FIG. 4. With each lead portion 43, a portion thereof is exposed from the sealing resin 5 and the portion exposed from the sealing resin 5 is a terminal for mounting the semiconductor device A1 to the circuit board. Here, with each lead portion 43, at least the portion exposed from the sealing resin 5 is covered by plating. Also, each lead portion 43 is bent at the portion exposed from the sealing resin 5. In this preferred embodiment, eight lead portions 43 are exposed from each end edge in the Y direction of the sealing resin 5 in plan view. Here, the positioning and number of the plurality of lead portions 43 are not restricted to those shown in FIG. 1 and FIG. 4.

Each of the plurality of lead portions 43a is connected to the bonding pad portion 42a. Since the bonding pad portion 42a is in conduction with the first electrodes 121 of the first semiconductor element 1A and the first electrodes 121 are the source electrodes as described above, the plurality of lead portions 43a are source terminals of the first semiconductor element 1A.

Each of the plurality of lead portions 43b is connected to the bonding pad portion 42b. Since the bonding pad portion 42b is in conduction with the first electrodes 121 of the first semiconductor element 1B and the first electrodes 121 are the source electrodes as described above, the plurality of lead portions 43b are source terminals of the first semiconductor element 1B.

Each of the plurality of lead portions 43c is connected to the bonding pad portion 42c. Since the bonding pad portion 42c is in conduction with the respective second electrodes 122 of the respective first semiconductor elements 1A and 1B and the respective second electrodes 122 are the drain electrodes as described above, the plurality of lead portions 43c are drain terminals of the respective first semiconductor elements 1. Although in this preferred embodiment, drain terminals in common to the first semiconductor elements 1A and 1B are arranged by the bonding pad portion 42c and the plurality of lead portions 43c, a drain terminal may be arranged separately for each of the first semiconductor elements 1A and 1B instead.

Each of the plurality of lead portions 43d is connected respectively to each of the bonding pad portions 42d. The respective bonding pad portions 42d are in conduction with the second semiconductor element 2 as described above. The plurality of lead portions 43d are appropriately in conduction with the second semiconductor element 2 such as to respectively function, for example, as a power grid terminal, a control terminal of the device, an analog power supply input terminal, a feedback terminal, a soft-start time setting terminal, a spread spectrum setting terminal, a mode switching terminal, an internal constant voltage control terminal, or an ERRAMP output terminal, etc. Also, the above is an example and conduction with the second semiconductor element 2 may be achieved to realize functions as terminals besides the above. Also, although not appearing in FIG. 4, in this preferred embodiment, the third electrodes 123 of the respective first semiconductor elements 1 are in conduction with the second semiconductor element 2.

Each of the plurality of side extension portions 44 is a portion that extends outward from an end edge in the X direction of the die pad portion 41. With each side extension portion 44, an end edge at one side in the X direction is connected to the die pad portion 41 and an end edge at the other side in the X direction is exposed from the sealing resin 5. With the side extension portions 44 in this preferred embodiment, two side extension portions 44 extend outward respectively from each of the end edges in the X direction of the die pad portion 41 and the two side extension portions 44 are respectively disposed at respective end edge sides in the Y direction of the die pad portion 41 in plan view.

As shown in FIG. 1 to FIG. 6, the sealing resin 5 covers the plurality of first semiconductor elements 1, the second semiconductor element 2, the plurality of first conductive members 31, the plurality of second conductive members 32, and a portion of the lead frame 4. The sealing resin 5 is constituted of a raw material having an insulating property. In this preferred embodiment, the sealing resin 5 is constituted, for example, of an epoxy resin of black color. The sealing resin 5 has a rectangular shape in plan view.

<<Method for Manufacturing the Semiconductor Device A1>>

Figure 12A:
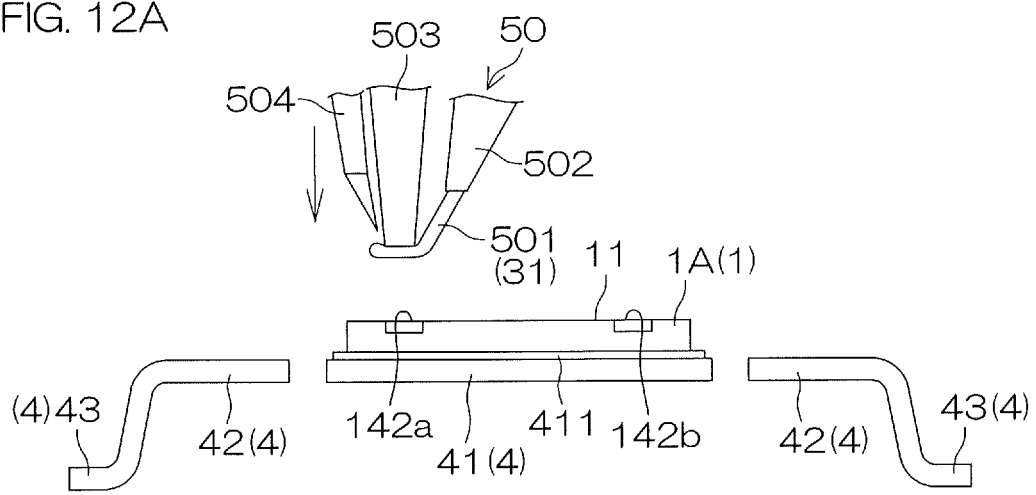
FIG. 12A to FIG. 12C are diagrams of portions of a manufacturing process of the semiconductor device.
Figure 12B:
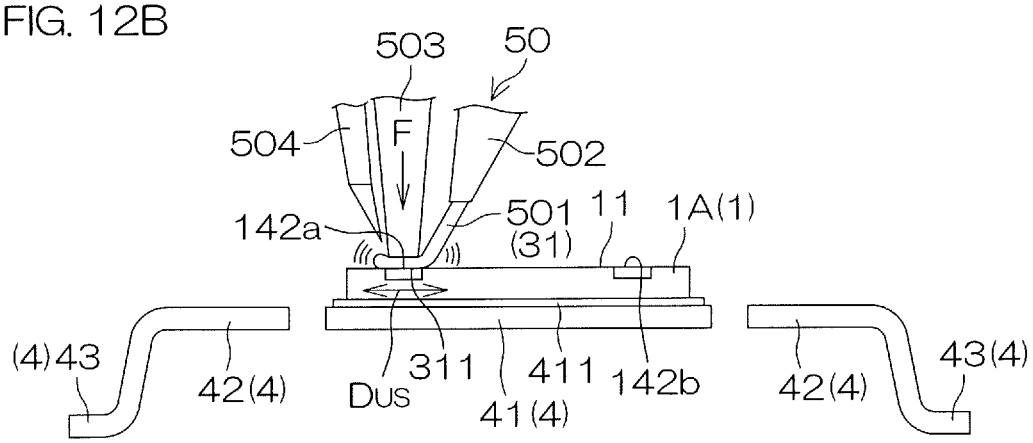
Figure 12C:
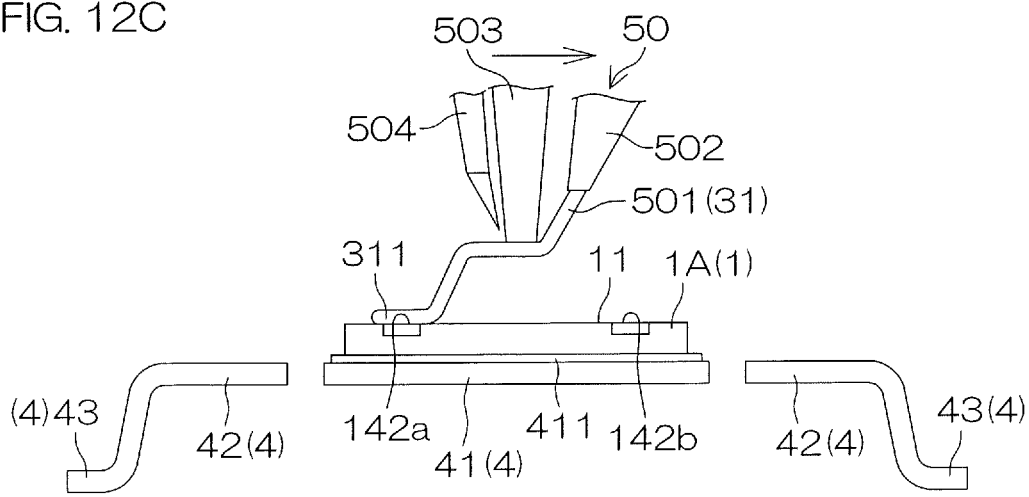

Next, in regard to a method for manufacturing the semiconductor device A1, a method for joining a first conductive member 31 shall be described in particular. FIG. 12A to FIG. 12C are diagrams of steps in a manufacturing process of the semiconductor device A1 that are related to the joining of the first conductive member 31.

After the plurality of element electrodes 12, the wiring layer 13, the insulating layer 19, the plurality of vias 20, and the protective layer 23 are formed on the semiconductor substrate 11 described above, the semiconductor substrate 11 is bonded to the die pad portion 41 via the joining material 411.

Next, as shown in FIG. 12A to FIG. 12C, the first conductive member 31 is joined to a first pad portion 142a. In the joining of the first conductive member 31, for example, a wedge bonder 50 is used. The wedge bonder 50 includes a wire guide 502 that holds a thin metal wire 501 that becomes a material of the first conductive member 31, the wedge tool 503 that applies a load and ultrasonic waves to the thin metal wire 501, and a cutter 504 that cuts the thin metal wire 501 after joining.

First, as shown in FIG. 12A, in a state where an end portion of the thin metal wire 501 is clamped by the wedge tool 503, the wedge bonder 50 is lowered until the thin metal wire 501 contacts the first pad portion 142a.

Figure 13:
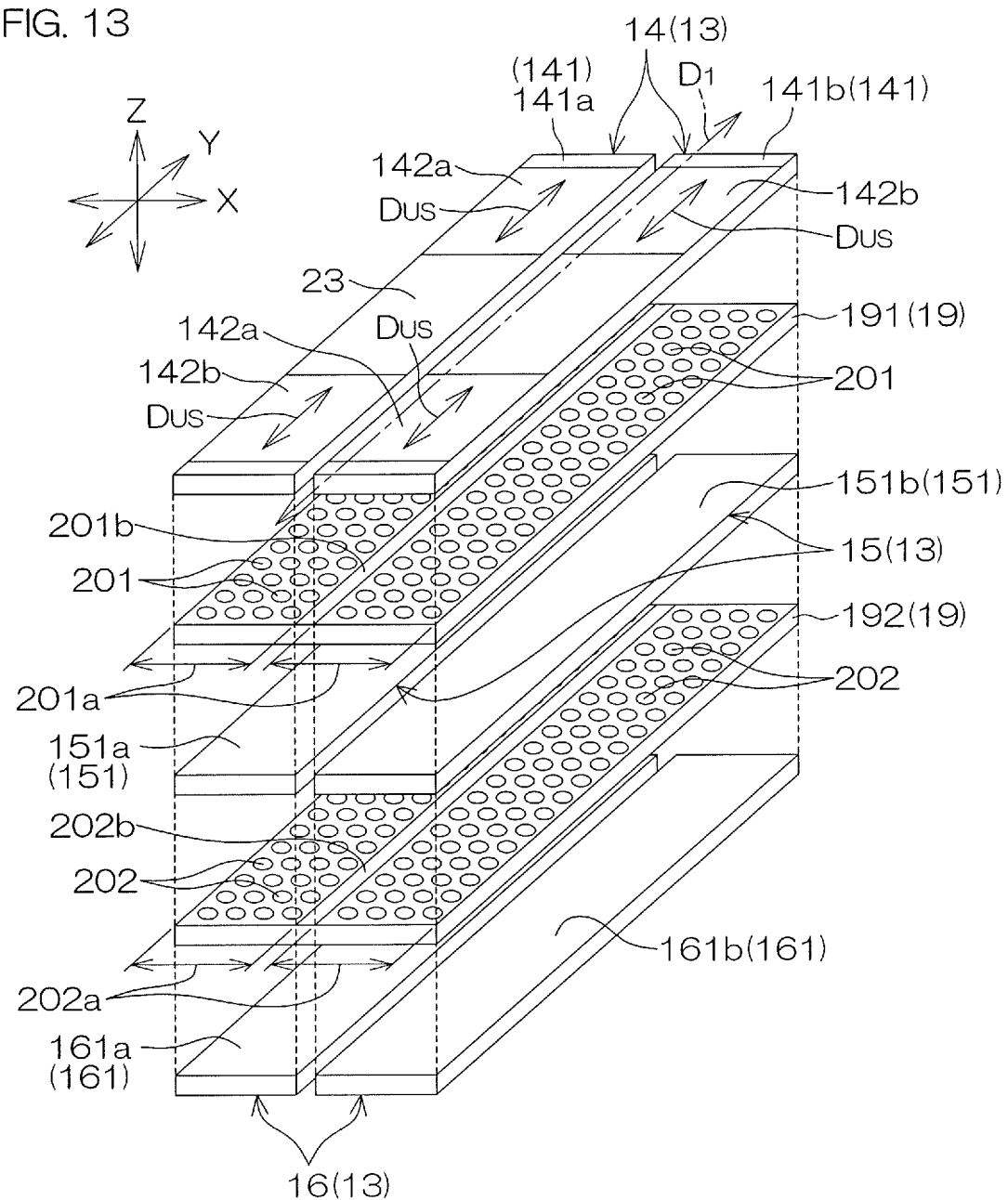
FIG. 13 is a diagram for describing an application direction of ultrasonic waves.

Next, as shown in FIG. 12B, the ultrasonic waves US are applied while applying the load F from above to below on the thin metal wire 501. An application direction (vibration direction $D_{US}$) of the ultrasonic waves US is a direction oriented along the long direction $D_1$ (Y direction) of the second plate members 151 as shown in FIG. 13. Although an angle between the vibration direction $D_{US}$ and the direction $D_1$ in plan view in this preferred embodiment is 0° (the vibration direction $D_{US}$ and the direction $D_1$ are parallel), the angle of the vibration direction $D_{US}$ with respect to the direction $D_1$ suffices to be in a range of −30° to 30°. The end portion of the thin metal wire 501 is thereby joined to the first pad portion 142a and a joint portion 311 is formed.

Next, as shown in FIG. 12C, the wedge bonder 50 moves to a position above the second pad portion 142b while keeping the clamped state of the thin metal wire 501 by the wedge tool 503. The load F and the ultrasonic waves US are then applied as in FIG. 12B to form a joint portion 312. Thereafter, by the same method, the thin metal wire 501 is joined to the bonding pad portion 42a and cut by the cutter 504 to complete the joining of the first conductive member 31.

After this series of wire bonding steps are performed on all first conductive members 31 and all second conductive members 32, the lead frame 4 and the structure on the lead frame 4 is sealed by the sealing resin 5 and the semiconductor device A1 is thereby obtained.

<<Actions and Effects of the Semiconductor Device A1>>

Next, actions and effects of the semiconductor device A1 according to this preferred embodiment shall be described.

As shown in FIG. 13, according to the method for manufacturing the semiconductor device A1 described above, the angle of the vibration direction $D_{US}$ of the ultrasonic waves US with respect to the long direction $D_1$ (Y direction) of the second plate members 151 is set in a range of −30° to 30°. By thus setting the vibration direction $D_{US}$ of the ultrasonic waves US applied by the wedge bonding, the angles $\theta_1$ and $\theta_2$ of the directions $D_{W1}$ and $D_{W2}$ of extension of the first conductive members 31 with respect to the direction $D_1$ (Y direction) of extension of the second plate members 151 can be set to −30° to 30° as shown in FIG. 8.

Forming of a crack in the insulating layer 19 (first interlayer insulating film 191) in a periphery of the first plate members 141 can thereby be suppressed. For example, forming of a crack in a vicinity of a boundary portion 144 between a first via portion 201a and a non-first-via portion 201b in the first interlayer insulating film 191 (see FIG. 7B) can be suppressed. Presence/absence of this type of crack can be checked, for example, by exposing the boundary portion 144 between the first via portion 201a and the non-first-via portion 201b by removing the structure above the first interlayer insulating film 191 by an etching liquid, etc.

Also, according to the semiconductor device A1, each second plate member 151 is formed of a solid pattern below a first pad portion 142a and a second pad portion 142b. Forces applied to the first pad portion 142a and the second pad portion 142b during ultrasonic joining of a first conductive member 31 can thereby be received uniformly by an entirety of the second plate member 151.

Further, with this preferred embodiment, the first via portions 201a that are collective bodies of first vias 201 between the first plate members 141 and the second plate members 151 are each formed of a solid pattern like the second plate members 151. Therefore, in the first interlayer insulating film 191, the boundary portions 144 between the first via portions 201a and the non-first-via portions 201b (see FIG. 7B) can be separated in a lateral direction from regions below the first pad portions 142a and the second pad portions 142b.

Forming of a crack in the insulating layer 19 (first interlayer insulating film 191) in the periphery of the first plate members 141 can be suppressed thereby as well. For example, forming of a crack in a vicinity of a boundary portion 144 between a first via portion 201a and a non-first-via portion 201b in the first interlayer insulating film 191 (see FIG. 7B) can be suppressed.

When MOSFETs of lateral type such as the respective first semiconductor elements 1 are formed on the semiconductor substrate 11, wiring layers that should be insulated from each other may become disposed adjacent to each other below a pad portion due to restriction of space on the semiconductor substrate 11. In this preferred embodiment, the first electrode conductive members 141a (source side wirings) and the second electrode conductive members 141b (drain side wirings) are disposed adjacently as wiring layers to be insulated from each other. Even in such a case, if forming of a crack in the first interlayer insulating film 191 can be suppressed as described above, short-circuiting between first electrode conductive members 151a (source side wirings) and the second electrode conductive members 151b (drain side wirings) can be suppressed effectively. Consequently, the semiconductor device A1 of high reliability can be provided.

How a rate of formation of a crack in an insulating layer changes according to the vibration direction $D_{US}$ of ultrasonic waves is illustrated in FIG. 15 and FIG. 16. The evaluations in FIG. 15 and FIG. 16 are those each obtained when an aluminum wire is joined to a pad portion 609 of an uppermost layer of a wiring layer 60 shown in FIG. 14.

The wiring layer 60 has a three-layer structure and includes first plate members 601, second plate members 602, and third plate members 603 that are disposed such as to be alternately orthogonal in succession from the top. The first plate members 601 and the third plate members 603 extend in the Y direction and the second plate members 602 extend in the X direction. A first interlayer insulating film 606 in which a plurality of first vias 604 are formed is interposed between the first plate members 601 and the second plate members 602. A second interlayer insulating film 607 in which a plurality of second vias 605 are formed is interposed between the second plate members 602 and the third plate members 603. Also, front surfaces of the first plate members 601 are covered by a protective layer 608 and portions of the first plate members 601 are exposed as the pad portions 609 from openings in the protective layer 608.

Here, FIG. 15 shows results of cases where, as in the method of FIG. 12B and FIG. 13, an aluminum wire is joined by applying ultrasonic waves at an angle of 0° (parallel to the direction $D_1$) with respect to the direction $D_1$(X direction) in which the second plate members 602 extend. On the other hand, FIG. 16 shows results of cases where an aluminum wire is joined by applying ultrasonic waves at an angle of 90° (orthogonal to the direction $D_1$) with respect to the direction $D_1$ (X direction) in which the second plate members 602 extend.

As shown in FIG. 15, if an aluminum wire is joined by applying ultrasonic waves at an angle of 0° (parallel to the X direction) with respect to the direction $D_1$ (X direction) in which the second plate members 602 extend, an A evaluation of 0% crack formation rate can be achieved not just within a range of a process margin (an allowable variation amount taking variation in process into consideration) for aluminum wire joining but also outside the range of the process margin.

Further, since the second plate members 151 are formed across entire surfaces of the regions below the first pad portions 142a and the second pad portions 142b, the directivity of the second plate members 151 with respect to the vibration direction $D_{US}$ of ultrasonic waves shown in FIG. 13 can be eliminated. For example, even if the vibration direction $D_{US}$ is changed from a mode of being parallel to the direction $D_1$ as shown in FIG. 13 is changed such as to be orthogonal to the direction $D_1$, the force applied to the second plate members 151 of solid pattern would not change greatly. Consequently, the first conductive members 31 can be joined from various directions to the first pads 142a and the second pads 142b and therefore, the degree of freedom of directionality of the first conductive members 31 can be increased.

<<Variations of Materials of the First Pad Portions 142a and the Second Pad Portions 142b>>

Figure 17:
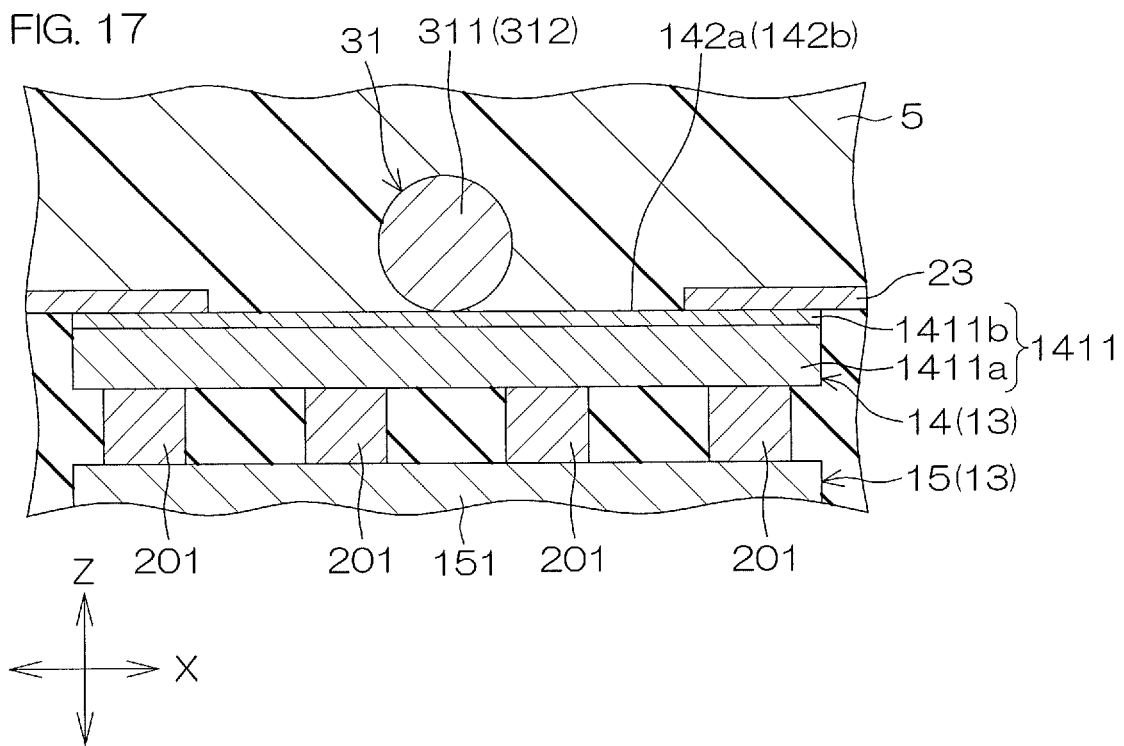
FIG. 17 is a diagram for describing a variation of materials of pad portions.
Figure 18:
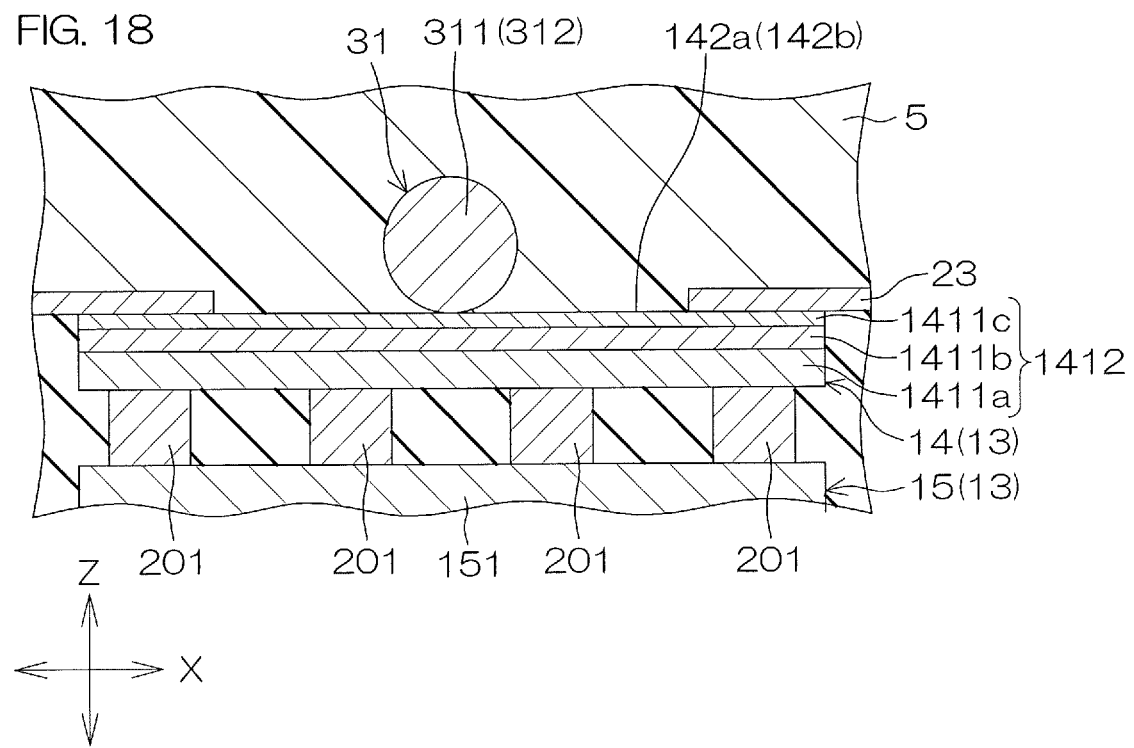
FIG. 18 is a diagram for describing a variation of the materials of the pad portions.

FIG. 17 and FIG. 18 are diagrams for describing variations of materials of the first pad portions 142a and the second pad portions 142b.

Although the conductive material of the first plate members 141 that forms the first pad portions 142a and the second pad portions 142b may be solely a material having Al as a main component as mentioned above, the materials indicated in FIG. 17 and FIG. 18 may be applied instead.

First, a first plate member 1411 shown in FIG. 17 includes a first layer 1411a that forms a shape of the first plate member 1411 and a second layer 1411b that is formed on the first layer 1411a. A conductive material of the first layer 1411a may, for example, be a material having Al (aluminum) and Cu (copper) as main components. On the other hand, a conductive material of the second layer 1411b may, for example, be a material having Ni (nickel) as a main component. Besides, for example, elemental Ni, the material having Ni as a main component may be an Ni alloy that contains Ni at a ratio of not less than 90 wt %.

The second layer 1411b may, for example, be a sputtered layer that is formed on the first layer 1411a by a sputtering method or may be a plated layer that is formed on the first layer 1411a by a plating method. Also, a thickness of the first layer 1411a may, for example, be 1.6 μm to 6.0 μm and a thickness of the second layer 1411b may, for example, be 1.0 μm to 5.0 μm.

By thus applying the second layer 1411b that is constituted of the material having Ni as a main component, a front surface of each first plate member 1411, that is, each first pad portion 142a and each second pad portion 142b can be formed of the material having Ni as a main component. Thereby, when Al wires are used as the first conductive members 31, compatibility of the first conductive members 31 with respect to the first pad portions 142a and the second pad portions 142b is increased and therefore, the first conductive members 31 can be joined to the first pad portions 142a and the second pad portions 142b with satisfactory joining strength.

Also, if as the first conductive members 31, two or more types among Al wires, Cu wires, and Au wires are used in combination, the materials of the first pad portions 142a and the second pad portions 142b may be changed in accordance with the materials of the first conductive members 31 that are joined to the first pad portions 142a and the second pad portions 142b, respectively. For example, for first pad portions 142a and second pad portions 142b to which Al wires are joined, the material of FIG. 17 having Ni as a main component may be adopted and for first pad portions 142a and second pad portions 142b to which Au wires are joined, the material of FIG. 9 to FIG. 11 having Al as a main component may be adopted.

Next, a first plate member 1412 shown in FIG. 18 includes a first layer 1412a that forms a shape of the first plate member 1412, a second layer 1412b that is formed on the first layer 1412a, and a third layer 1412c that is formed on the second layer 1412b. In this preferred embodiment, the first layer 1412a, the second layer 1412b, and the third layer 1412c may respectively be an example of a "first portion," a "second portion," and a "third portion" described in the Claims.

A conductive material of the first layer 1412a may, for example, be a material having Cu (copper) as a main component and, besides elemental Cu, may be a Cu alloy that contains Cu at a ratio of not less than 90 wt %. A conductive material of the second layer 1412b may, for example, be a material having Ni (nickel) as a main component and, besides elemental Ni, may be an Ni alloy that contains Ni at a ratio of not less than 90 wt %. A conductive material of the third layer 1412c may, for example, be a material having Pd (palladium) as a main component and, besides elemental Pd, may be a Pd alloy that contains Pd at a ratio of not less than 90 wt %.

The second layer 1412b and the third layer 1412c may, for example, be sputtered layers that are formed successively on the first layer 1412a by a sputtering method or may be plated layers that are formed successively on the first layer 1412a by a plating method. Also, a thickness of the first layer 1412a may, for example, be 6.0 μm to 10.0 μm, a thickness of the second layer 1412b may, for example, be 1.0 μm to 5.0 μm, and a thickness of the third layer 1412c may, for example, be 0.01 μm to 0.4 μm.

By thus applying the third layer 1412c that is constituted of the material having Pd as a main component, a front surface of each first plate member 1412, that is, each first pad portion 142a and each second pad portion 142b can be formed of the material having Pd as a main component.

Also, in regard to the material of the first pad portions 142a and the second pad portions 142b, there is no need to unify to any of the material of FIG. 9 to FIG. 11 having Al as a main component, the material of FIG. 17 having Ni as a main component, and the material of FIG. 18 having Pd as a main component and, for example, two or more of the three types of material may be adopted in combination.

<<Variations of Shape of the Second Plate Members 151>>

Figure 19:
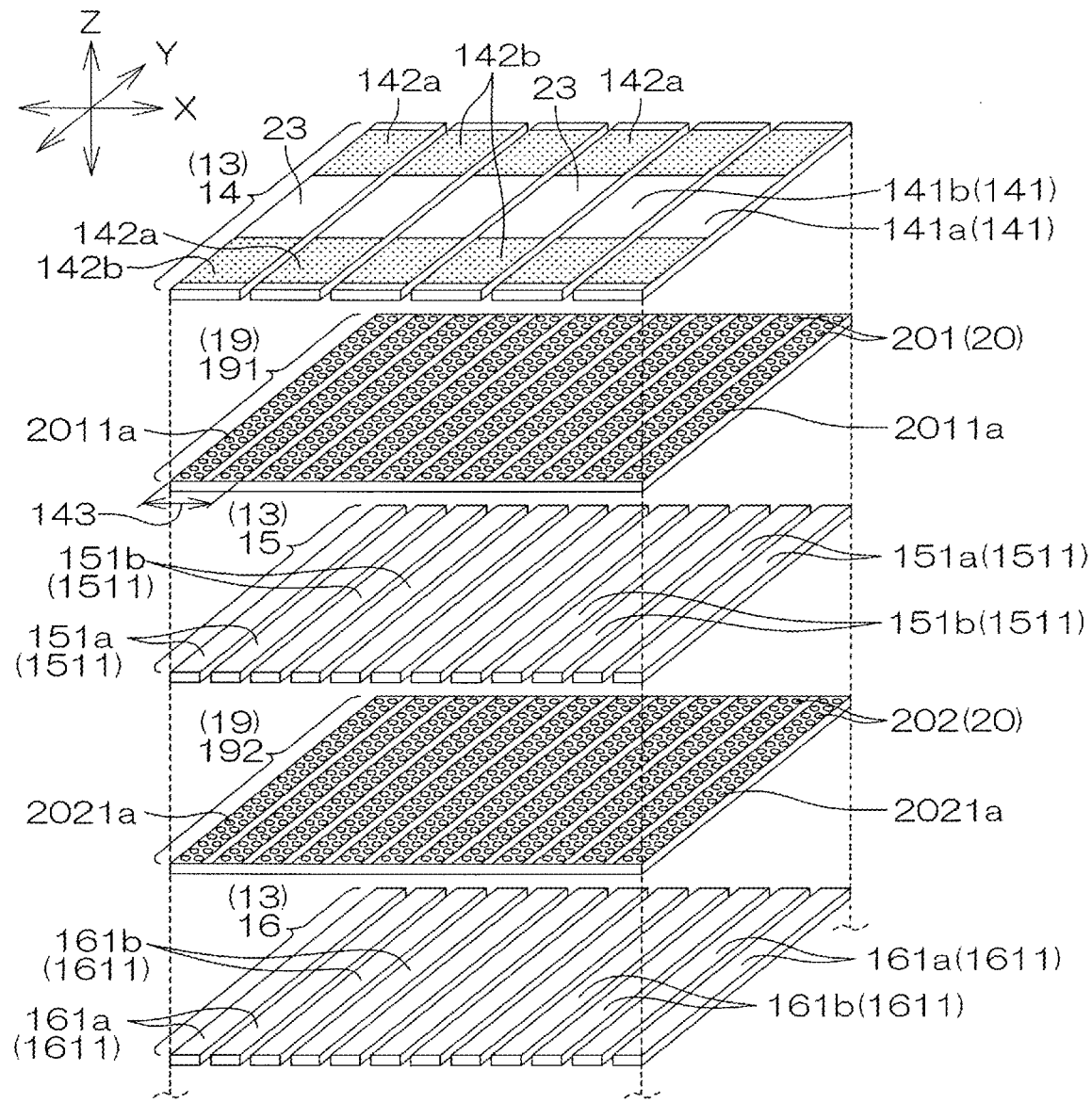
FIG. 19 is a diagram for describing a variation of a shape of the second plate members.
Figure 20:
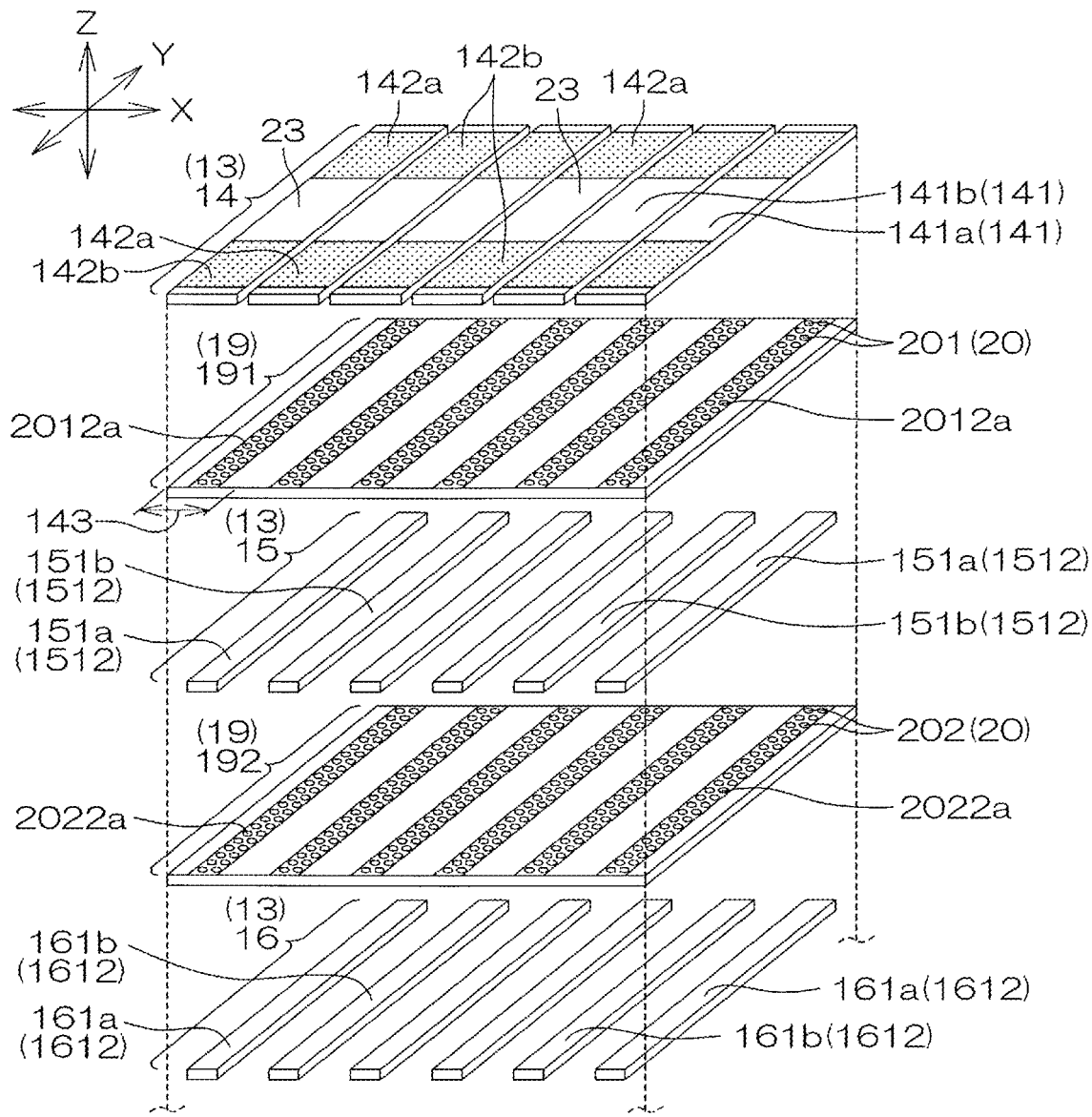
FIG. 20 is a diagram for describing a variation of the shape of the second plate members.

FIG. 19 and FIG. 20 are diagrams for describing variations of a shape of the second plate members 151.

The second plate members 151 may be formed of solid patterns in the lower regions 143 below the first plate members 141 as described above but, as shown in FIG. 19 and FIG. 20, do not have to be formed of solid patterns.

First, second plate members 1511 shown in FIG. 19 are thin in comparison to the lower regions 143 (regions overlapping with the first plate members 141 in plan view) below the first plate members 141 and are formed, for example, as lines. A plurality (two in FIG. 19) of the second plate members 1511 are formed in each lower region 143 below a first plate member 141. That is, in each lower region 143 below a first plate member 141, two second plate members 1511 extend in the Y direction at an interval from each other.

Also, as with the second plate members 1511, first via portions 2011a between the second plate members 1511 and the first plate members 141 may be thin in comparison to the first plate members 141 and may, for example, be formed to the same shape in plan view as the second plate members 1511. Further, third plate members 1611 and second via portions 2021a may be formed to the same shapes in plan view as the second plate members 1511 and the first via portions 2011a, respectively, of FIG. 19.

Next, as with the second plate members 1511 of FIG. 19, second plate members 1512 shown in FIG. 20 are thin in comparison to the lower regions 143 (regions overlapping with the first plate members 141 in plan view) below the first plate members 141 and are formed, for example, as lines. The second plate members 1512 are formed in one-to-one correspondence with the respective first plate members 141 and, in each lower region 143 below one first plate member 141, one second plate member 1512 extends in the Y direction.

Also, as with the second plate members 1512, first via portions 2012a between the second plate members 1512 and the first plate members 141 may be thin in comparison to the first plate members 141 and may, for example, be formed to the same shape in plan view as the second plate members 1512. Further, third plate members 1612 and second via portions 2022a may be formed to the same shapes in plan view as the second plate members 1512 and the first via portions 2012a, respectively, of FIG. 20.

Even in the structures of FIG. 19 and FIG. 20, the second plate members 1511 and 1512 extend in the Y direction. The angles $\theta_1$ and $\theta_2$ of the directions $D_{W1}$ and $D_{W2}$ in which the first conductive members 31 extend with respect to the direction $D_1$ (Y direction) in which the second plate members 1511 and 1512 extend can therefore be set to −30° to 30°. Forming of a crack in the insulating layer 19 (first interlayer insulating film 191) in the periphery of the first plate members 141 can thereby be suppressed.

Although the preferred embodiment of the present invention has been described above, the present invention may be implemented in yet other modes.

For example, although with the preferred embodiment described above, a case where the semiconductor device A1 includes the plurality of the first semiconductor elements 1 and the second semiconductor element 2, there is no restriction thereto. For example, there may be one first semiconductor element 1 and the second semiconductor element 2 does not have to be included.

Also, although with the preferred embodiment described above, the long direction $D_2$ of the third plate members 161 is parallel to the long direction $D_1$ of the second plate members 151, 1511, or 1512, it may be orthogonal instead.

Also, although being formed by wedge bonding with respect to the first pad portions 142a and the second pad portions 142b in the preferred embodiment described above, the first conductive members 31 may be formed by ball bonding instead.

Besides the above, various design changes can be applied within the scope of matters described in the Claims.

Also, from the description in this Description and the drawings, features such as the following can be extracted besides the invention described in the Claims.

[B1] A semiconductor device including
  a pad portion,
  an insulating layer that supports the pad portion,
  a first wiring layer that is formed in a layer below the pad portion and has a solid pattern below the pad portion, and
  a conductive member that is joined to a front surface of the pad portion.

According to this arrangement, the first wiring layer is formed of a solid pattern below the pad portion. Forming of a crack in the insulating layer can thereby be suppressed. Here, that the first wiring layer has the solid pattern below the pad portion may include, for example, the meanings that the first wiring layer is formed such as to cover an entire surface of a region below the pad portion, that the first wiring layer is formed without being divided in the region below the pad portion, that the first wiring layer is formed without gaps in the region below the pad portion, etc.

[B2] The semiconductor device according to B1, where the pad portion contains a material having aluminum as a main component.

[B3] The semiconductor device according to B1 or 2, where the conductive member contains a material having either of aluminum and copper as a main component.

[B4] The semiconductor device according to any one of B1 to 3, where a joint portion of the conductive member with respect to the pad portion includes a joint portion that is formed by wedge bonding.

[B5] The semiconductor device according to B4, where two or more of the joint portions of the conductive member are formed.

[B6] The semiconductor device according to any one of B1 to 5, where the conductive member includes a linear member having a thickness of 100 µm to 600 µm.

[B7] The semiconductor device according to any one of B1 to 6, where a thickness of the pad portion is 1.6 µm to 6.0 µm.

[B8] The semiconductor device according to any one of B1 to 7, including
  a semiconductor substrate that has a substrate principal surface,
  a first element electrode that is formed on the substrate principal surface and is in conduction with the first wiring layer,
  a second element electrode that is formed on the substrate principal surface at an interval from the first element electrode and with which a channel current flows between it and the first element electrode via the semiconductor substrate, and
  a second wiring layer that is formed in the same layer as the first wiring layer at an interval from the first wiring layer and is in conduction with the second element electrode.

Among such cases where an element structure through which the channel current flows in a lateral direction along the substrate principal surface is formed in the semiconductor substrate, there is a case where, due to restriction of space on the semiconductor substrate, the second wiring layer is formed in a periphery of the first wiring layer. If in such a case, the forming of a crack in the insulating layer can be suppressed as described above, short-circuiting between the first wiring layer and the second wiring layer can be suppressed. Consequently, a semiconductor device of high reliability can be provided.

[B9] The semiconductor device according to any one of B1 to 8, where the conductive member extends in a first direction in plan view and
a third wiring layer that is formed in a layer below the first wiring layer and extends in the first direction below the first wiring layer is included.

[B10] The semiconductor device according to B9, including a via portion that is formed between the first wiring layer and the third wiring layer, connects the first wiring layer and the third wiring layer, and extends in the first direction in plan view.

[B11] The semiconductor device according to any one of B1 to 10, where the pad portion includes a front surface to which the conductive member is joined and the front surface of the pad portion contains a material having nickel as a main component.

[B12] The semiconductor device according to any one of B1 to 10, where the pad portion includes a first portion that is formed of a material having copper as a main component, a second portion that is formed of a material having nickel as a main component on the first portion, and a third portion that is formed of a material having palladium as a main component on the second portion and forms the front surface of the pad portion.

The present application corresponds to Japanese Patent Application No. 2020-054750 filed on Mar. 25, 2020 in the Japan Patent Office and to Japanese Patent Application No. 2020-054751 filed on Mar. 25, 2020 in the Japan Patent Office, and the entire disclosures of these applications are incorporated herein by reference.

REFERENCE SIGNS LIST

A1: semiconductor device
$D_1$: direction
$D_2$: direction
$D_{US}$: direction
$D_W$: direction
$D_{W2}$: direction
$D_{W3}$: long direction
$\theta_1$: angle
$\theta_2$: angle
$\theta_3$: angle
1: first semiconductor element
1A: first semiconductor element
1B: first semiconductor element
2: second semiconductor element
11: semiconductor substrate
12: element electrode
13: wiring layer
14: first conductive layer
15: second conductive layer
16: third conductive layer
19: insulating layer
20: via
31: first conductive member
60: wiring layer
111: substrate principal surface
121: first electrode
122: second electrode
141: first plate member
142a: first pad portion
142b: second pad portion
151: second plate member
151a: first electrode conductive member
151b: second electrode conductive member
161: third plate member
161a: first electrode conductive member
161b: second electrode conductive member
191: first interlayer insulating film
311: joint portion
312: joint portion
315: extension portion
501: thin metal wire
601: first plate member
602: second plate member
606: first interlayer insulating film
609: pad portion
1411: first plate member
1411a: first layer
1411b: second layer
1412: first plate member
1412a: first layer
1412b: second layer
1412c: third layer
1511: second plate member
1512: second plate member

The invention claimed is:

1. A semiconductor device comprising:
a pad portion;
an insulating layer that supports the pad portion;
a first wiring layer that is formed in a layer below the pad portion and extends in a first direction below the pad portion; and
a conductive member that is joined to multiple locations on a front surface of the pad portion and extends in a direction forming an angle of −30° to 30° with respect to the first direction, wherein
the conductive member is thicker than the pad portion, and
the conductive member includes a bridge portion extending between a plurality of joint portions located at multiple locations on the pad portion, and
the bridge portion connects one joint portion to another.

2. The semiconductor device according to claim 1, wherein the joint portion of the conductive member with respect to the pad portion includes a joint portion that is long in one direction in plan view.

3. A semiconductor device comprising:
a pad portion;
an insulating layer that supports the pad portion;
a first wiring layer that is formed in a layer below the pad portion and extends in a first direction below the pad portion; and
a conductive member that is joined to multiple locations on a front surface of the pad portion and has a joint portion that is long in one direction in plan view, wherein
the conductive member is thicker than the pad portion,
an angle of a long direction of the joint portion with respect to the first direction is −30° to 30°, and
the conductive member includes a bridge portion extending between a plurality of joint portions located at multiple locations on the pad portion, and
the pad portion connects one joint portion to another.

4. The semiconductor device according to claim 1, wherein the pad portion contains a material having aluminum as a main component.

5. The semiconductor device according to claim 1, wherein the conductive member contains a material having either of aluminum and copper as a main component.

6. The semiconductor device according to claim 1, wherein two or more of the joint portions of the conductive member are formed.

7. The semiconductor device according to claim 1, wherein the conductive member includes a linear member having a thickness of 100 μm to 600 μm.

8. The semiconductor device according to claim 1, wherein a thickness of the pad portion is 1.6 μm to 6.0 μm.

9. The semiconductor device according to claim 1, comprising:
- a semiconductor substrate that has a substrate principal surface;
- a first element electrode that is formed on the substrate principal surface and is in conduction with the first wiring layer;
- a second element electrode that is formed on the substrate principal surface at an interval from the first element electrode and with which a channel current flows between it and the first element electrode via the semiconductor substrate; and
- a second wiring layer that is formed in the same layer as the first wiring layer at an interval from the first wiring layer and is in conduction with the second element electrode.

10. The semiconductor device according to claim 1, comprising:
- a third wiring layer that is formed in a layer below the first wiring layer and extends in a second direction below the first wiring layer; and
- wherein the second direction is parallel or orthogonal to the first direction.

11. The semiconductor device according to claim 1, wherein the front surface of the pad portion contains a material having nickel as a main component.

12. The semiconductor device according to claim 1, wherein the pad portion includes a first portion that is formed of a material having copper as a main component, a second portion that is formed of a material having nickel as a main component on the first portion, and a third portion that is formed of a material having palladium as a main component on the second portion and forms the front surface of the pad portion.

13. A method for manufacturing semiconductor device comprising:
- a step of preparing a semiconductor substrate including a pad portion, an insulating layer that supports the pad portion, and a first wiring layer that is formed in a layer below the pad portion and extends in a first direction below the pad portion; and
- a step of joining a conductive member to multiple locations on a front surface of the pad portion by an ultrasonic vibration applied along a direction that forms an angle of −30° to 30° with respect to the first direction, wherein
  the conductive member is thicker than the pad portion,
  the conductive member includes a bridge portion extending between a plurality of joint portions located at multiple locations on the pad portion, and
  the bridge portion connects one joint portion to another.

* * * * *